United States Patent [19]

Tanaka et al.

[11] Patent Number: 5,748,532
[45] Date of Patent: May 5, 1998

[54] SEMICONDUCTOR NONVOLATILE MEMORY DEVICE AND COMPUTER SYSTEM USING THE SAME

[75] Inventors: Toshihiro Tanaka, Akiruno; Masataka Kato, Koganei; Katsutaka Kimura, Akishima; Tetsuya Tsujikawa, Hamura; Kazuyoshi Oshima, Ome; Kazuyuki Miyazawa, Hidaka, all of Japan

[73] Assignee: Hitachi, Ltd., Tokyo, Japan

[21] Appl. No.: 677,842

[22] Filed: Jul. 10, 1996

[30] Foreign Application Priority Data

Jul. 10, 1995 [JP] Japan ..................... 7-173089
Jun. 6, 1996 [JP] Japan ..................... 8-144176

[51] Int. Cl.$^6$ ..................... G11C 11/34
[52] U.S. Cl. ..................... 365/185.18; 365/185.22; 365/185.24
[58] Field of Search ..................... 365/185.22, 185.24, 365/185.18, 185.27, 185.28

[56] References Cited

U.S. PATENT DOCUMENTS 5,446,690 8/1995 Tanaka et al. ............... 365/185.25
5,592,415 1/1997 Kato et al. ............... 365/185.01

FOREIGN PATENT DOCUMENTS 3-34198 2/1991 Japan .
5-266680 10/1993 Japan .
6-124597 5/1994 Japan .
6-309883 11/1994 Japan .
7-211094 8/1995 Japan .

OTHER PUBLICATIONS

T. Tanaka, et al., "High-Speed Programming and Program-Verify Methods Suitable for Low-Voltage Flash Memories", 1994 IEEE Symposium on VLSI Circuits Digest of Technical Papers, pp. 61–62, May 1994.

1995 IEEE Internal Solid-State Circuits Conference, "A 3.3V High-Density AND Flash Memory with 1ms/512B Erase & Program Time", pp. 124–125, Feb. 16, 1995.

Primary Examiner—Joseph A. Popek
Attorney, Agent, or Firm—Antonelli, Terry, Stout, & Kraus, LLP

[57] ABSTRACT

A semiconductor nonvolatile memory device including transistors whose threshold voltages can be electrically rewritten (erased, written). A read-selected word line voltage Vrw, lower than the supply voltage Vcc applied from the outside, is applied, and the threshold voltage difference between the higher threshold voltage VthH and the lower threshold voltage VthL in the two states of the nonvolatile memory cells is reduced to bring the higher threshold voltage VthH close to the lower threshold voltage VthL. Moreover, a threshold voltage Vthi in the thermally equilibrium state of the memory cell, corresponding to the two threshold voltages of the two states, is set between the higher threshold voltage VthH and the lower threshold voltage VthL.

33 Claims, 24 Drawing Sheets

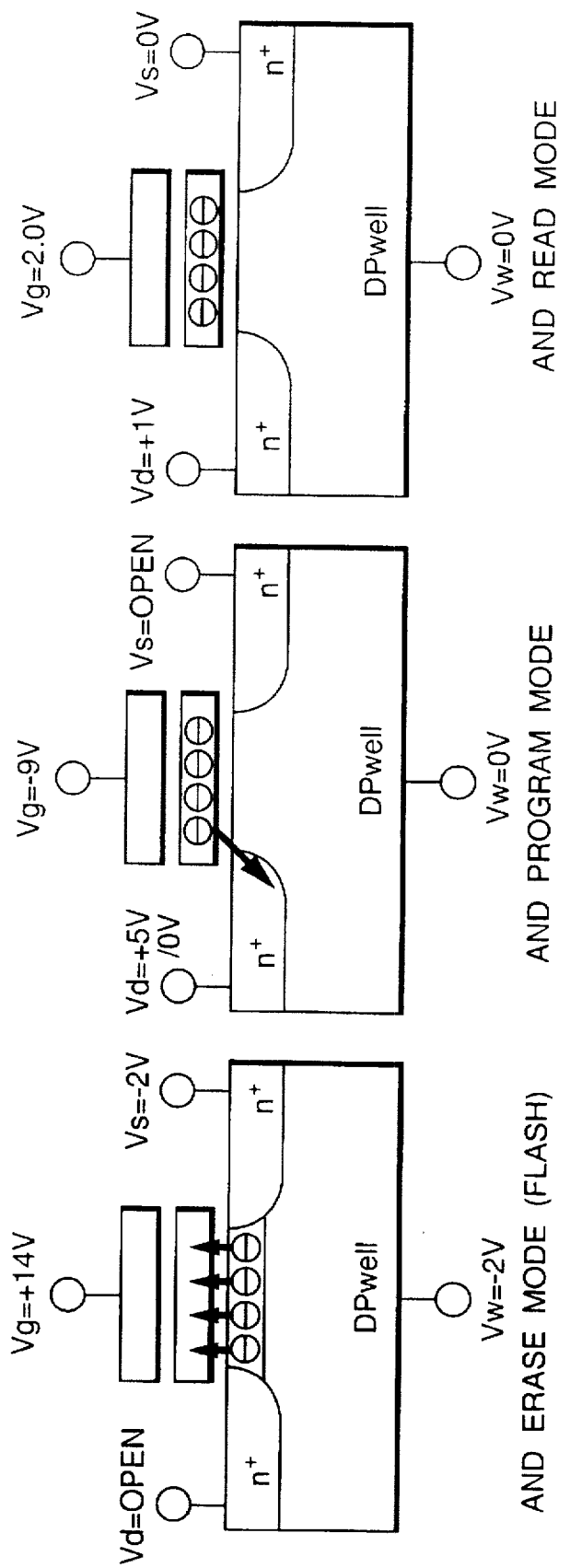

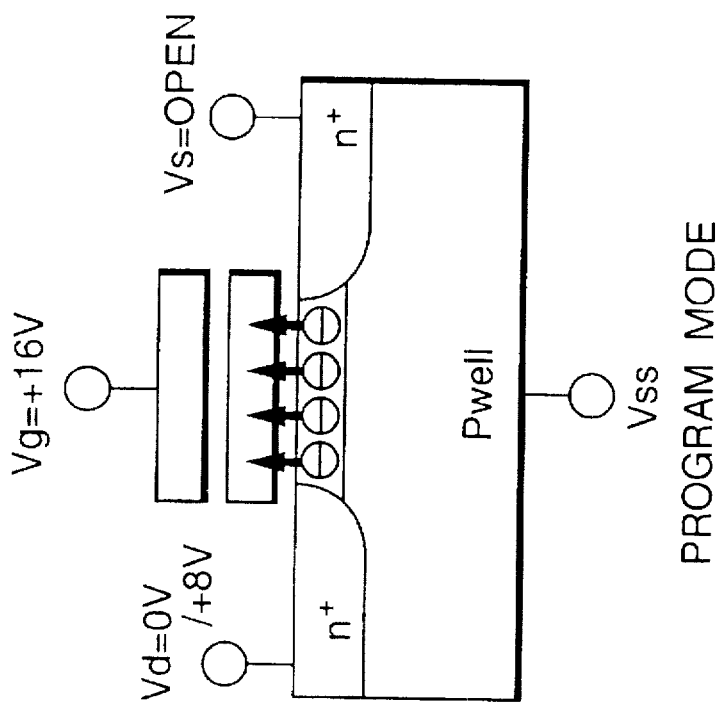
FIG. 29(b) PROGRAM MODE
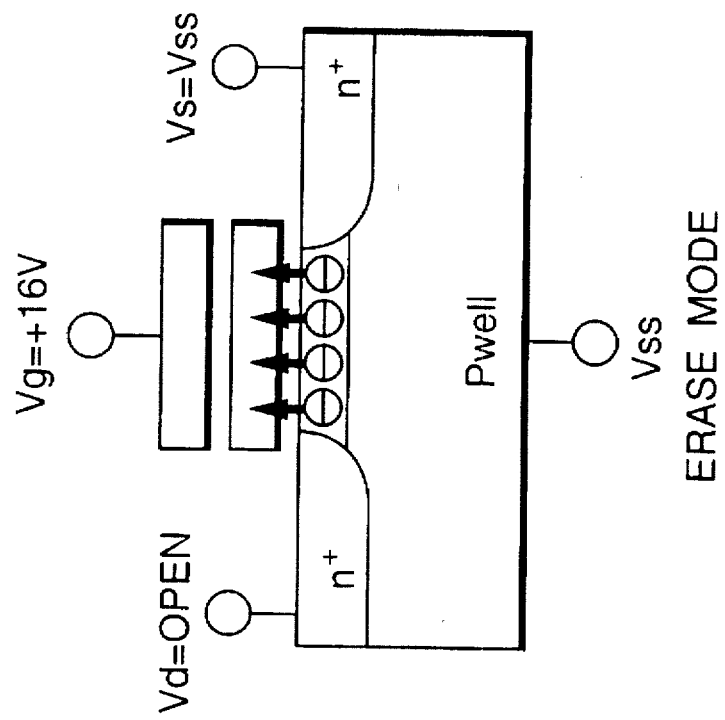
FIG. 29(a) ERASE MODE

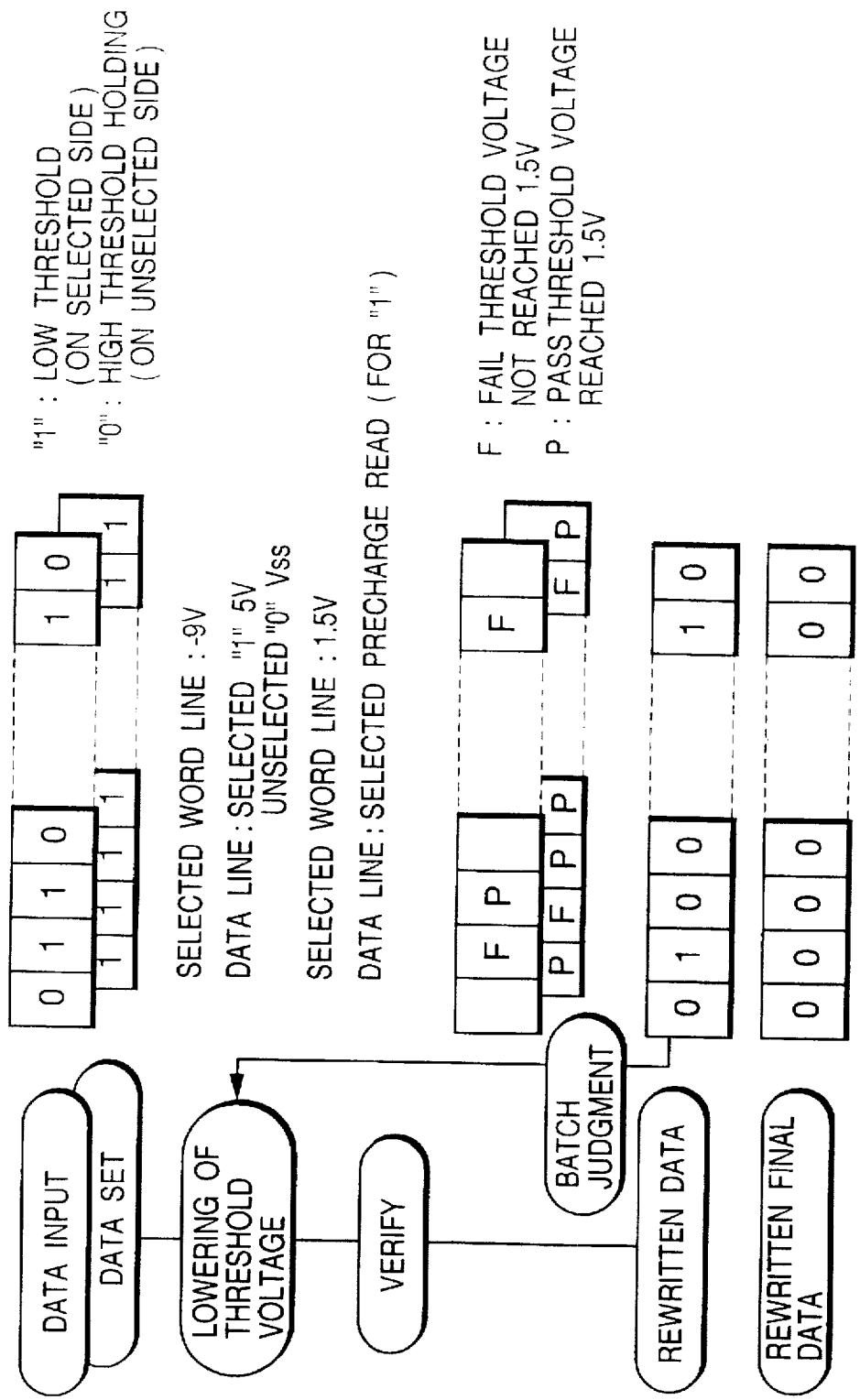

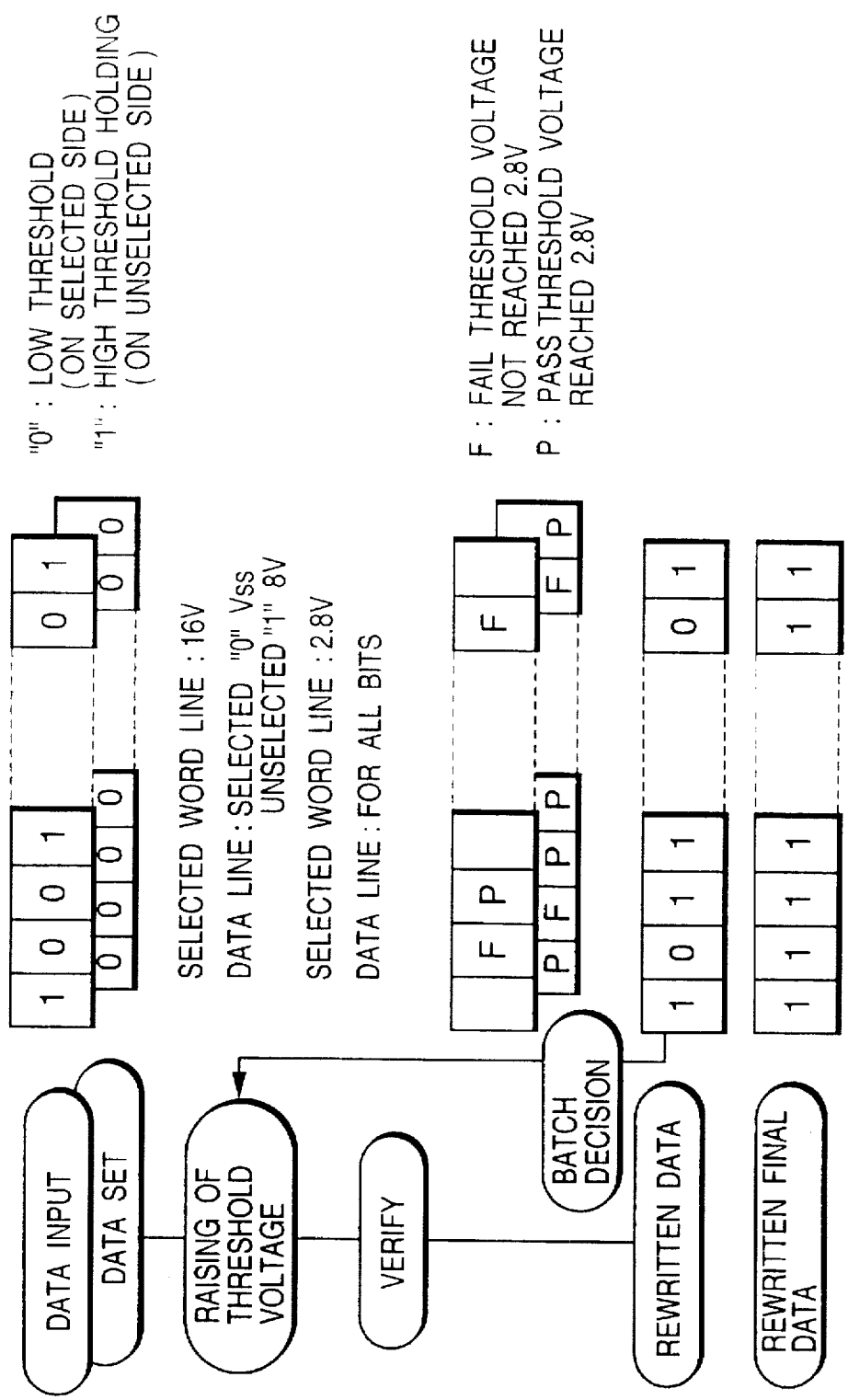

SEMICONDUCTOR NONVOLATILE MEMORY DEVICE AND COMPUTER SYSTEM USING THE SAME

BACKGROUND OF THE INVENTION

The present invention relates to a memory cell for maintaining a threshold voltage as data or a semiconductor nonvolatile memory device of which the data can be rewritten electrically and, more particularly, to a technique which is effective when applied to both a semiconductor nonvolatile memory device suited for frequently rewriting the data electrically and a computer system using the memory device.

As the technique we have examined, for example, there is the so-called "flash memory (EEPROM)" belonging to the semiconductor nonvolatile memory device having the one-transistor/cell construction of which the data can be erased electrically in a batch. Attention has been focused on the flash memory in recent years because the area occupied by one bit is so small that it can be highly integrated, and the structure and driving method have been widely researched and developed.

For example, there have been proposed the DINOR method disclosed on pp. 97 to 98, "Symposium on VLSI Circuits Digest of Technical Papers", 1993, the NOR method disclosed on pp. 99 to 100 of the same, 1993, the AND method disclosed on pp. 61 to 62 of the same, 1994, and the HICR method disclosed on pp. 19 to 22, "International Electron Devices Meeting Tech. Dig.", 1993.

In each of the above-specified methods, the voltage applied to a selected word line in the reading time is the supply voltage Vcc (e.g., 3.3 V) applied to the memory device from the outside. More specifically, in the current characteristics (threshold characteristics) with respect to the word line voltage in the read operation, both states (e.g., the two threshold voltage states) of the memory cell are over 0 V, and the read voltage of the selected word line at this time is the supply voltage Vcc between the two states. The unselected word line voltage is below the voltage, i.e., the ground voltage Vss corresponding to the lower threshold voltage.

Of the two states of the memory cell, the potential of the selected word line at the time of verifying the higher threshold value is higher than the maximum of the supply voltage Vcc and contains a retention margin, additionally. The verify potential on the lower threshold value side has a threshold over 0 V, at which the current of the memory cell does not flow at the unselected word line potential of 0 V. In the aforementioned AND method, for example, the verify word line potential is set to 1.5 V.

The read word line potential in the prior art described above is the supply voltage Vcc, and the threshold potential difference of the two states of the memory cell is over 3 V. The applied voltage necessary to rewrite (erase, program) the threshold of the memory cell in two states is determined by the coupling ratio, the threshold voltage Vthi and the higher threshold voltages VthH in the thermal equilibrium state, and the Vthi and the lower threshold voltage VthL. In order to change the threshold value of the memory cell to the higher state VthH in the aforementioned AND method, a voltage of 16 V is applied to the word line. For the lower state VthL, the voltage of the word line is a negative voltage of −9 V and the drain voltage is 4 V. Therefore a high potential is necessary.

SUMMARY OF THE INVENTION

In the technique called the aforementioned "flash memory (EEPROM)", the memory cell has a large threshold voltage difference (VthH−VthL) between the two states, so that the insulating film is deteriorated as a result of injecting electrons into the floating gate of the memory cell (the threshold voltage becomes high: toward VthH) or ejecting the electrons from the floating gate (the threshold voltage becomes high; toward VthL). This causes a problem that the rewrite cycles are restricted.

In the aforementioned AND method, on the other hand, in the operation of lowering the threshold voltage of the memory cell selectively (in the program operation), the unselected memory cell for which the higher threshold voltage (erase) state is desired to be held comes to a weak write state in which the gate voltage is −9 V and the drain voltage is the ground voltage Vss. Specifically, there is a problem that the word disturb resistance during the program operation is severe.

Therefore, an object of the present invention is to provide an electrically rewritable semiconductor nonvolatile memory device such that the rewrite (program, erase) operation voltage is lowered not by thinning the insulating film and improving the coupling ratio but by the rewrite threshold voltage, the deterioration of the insulating film at the time of injecting and releasing electrons into and out of the floating gate is suppressed thereby to improve the rewrite resistance, and to provide a computer system using the semiconductor nonvolatile memory device.

The above-specified and other objects and novel features of the present invention will become apparent from the following description to be made with reference to the accompanying drawings.

A summary of a number of main featured aspects of the invention disclosed herein will be briefly described hereinbelow.

Specifically, the present invention is applied to a semiconductor nonvolatile memory device which is composed of transistors whose data can be rewritten (erased, programmed) electrically. A read-selected word line voltage to be applied is made lower than the supply voltage Vcc to be applied to the memory device from the outside, thereby to decrease the threshold voltage difference (VthH−VthL) between the two states of a memory cell.

In order to lower the rewrite operation voltage, the threshold voltage Vthi in the thermally equilibrium state of the memory cell is defined to be a value between the two states VthH and VthL of the memory cell.

Especially, this read-selected word line voltage is preferably a value, which is the threshold voltage Vthi in the thermally equilibrium state ±0.5 V, and the threshold voltage difference (VthH−VthL) of the two states is, preferably, about 0.5 to 2.0 V.

For example, the charge Qfw after the floating gate sandwiched between two capacitors (C1 and C2) is rewritten is expressed by the following Equation:

$$\Delta Qfw = C2 \cdot (Vthw - Vthi) \qquad \text{Eq.1.}$$

where voltage Vthw is a threshold voltage after the rewrite operation. Moreover, the charge ΔQfw is proportional to the rewrite operation voltage applied to the word lines and the channel. In other words, the difference (Vthw−Vthi) is proportional to the rewrite operation voltage.

The computer system of the present invention includes at least a central processing unit and its peripheral circuit in addition to the aforementioned semiconductor nonvolatile memory device.

According to the semiconductor nonvolatile memory device thus far described and the computer system using the memory device, therefore, the damage on the insulating film at the time of injecting and releasing electrons into and out of the floating gate is reduced by lowering the rewrite operation voltage, and the film deterioration is markedly reduced. In other words, the restrictions upon the rewrite cycles can be greatly improved.

By defining the threshold voltage Vthi in the thermally equilibrium state which is between the threshold voltages VthH and VthL of the two states of the memory cell, moreover, the voltages to be applied for raising and lowering the threshold voltage Vth can be equalized in the rewrite operation voltage.

Moreover, since the information (data) retention characteristic is proportional to the threshold voltage Vthi in the thermally equilibrium state and the difference between the threshold voltages VthH and VthL after the rewrite operation, the read word line voltage can be determined considering the two data retentions for the reliability by defining the voltage Vthi between the voltage VthH and the voltage VthL. Hence the read word line voltage can be lowered and the disturb characteristics of the memory cell whose threshold voltage is desired to be retained high in lowering the threshold value can be improved.

As a result, the voltage of the electrically rewritable semiconductor nonvolatile memory device is lowered by the rewrite threshold voltage, so that the deterioration of the insulating film at the time of injecting and ejecting the electrons into and out of the floating gate can be suppressed and the rewrite resistance can be improved. Especially the computer using the memory device can be reduced in the power consumption and improved in the reliability thanks to the lowered voltage.

BRIEF DESCRIPTION OF THE DRAWINGS

FIGS. 27(a) to 27(b) are explanatory diagrams schematically explaining rewrite and read operations of the memory cell of FIG. 26 of the present embodiment;

FIGS. 29(a) and 29(b) explanatory diagram schematically explaining rewrite and read operations of the memory cell of FIG. 28 of the present embodiment;

FIG. 30 is an explanatory diagram showing the data contents in an operation to lowering the threshold voltage of a memory cell of the present embodiment;

FIG. 31 is an explanatory diagram showing the data contents in an operation of raising the threshold voltage of a memory cell of the present embodiment;

DESCRIPTION OF THE PREFERRED EMBODIMENTS

Figure 1:
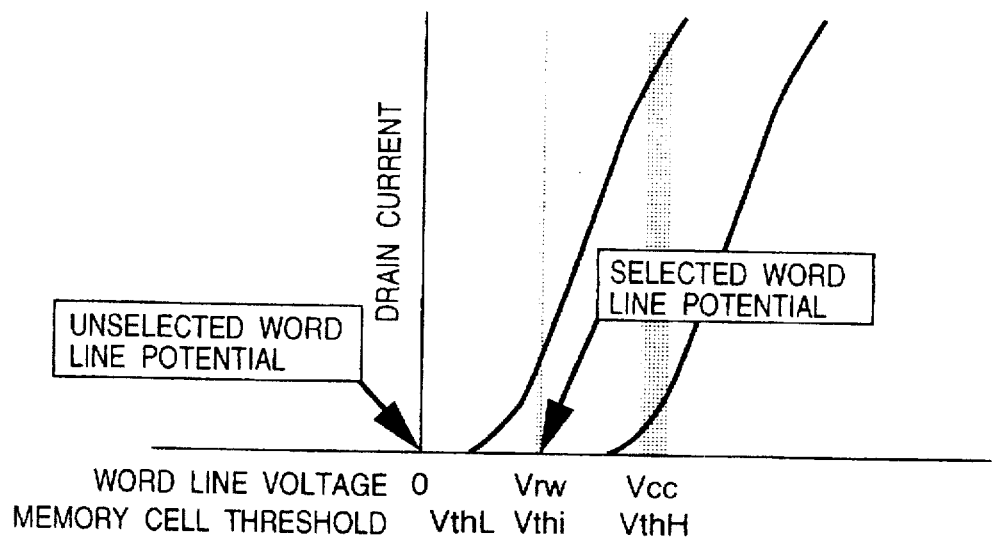
FIG. 1 is a characteristic diagram showing the current characteristic (threshold characteristic) with respect to the word line voltage in a reading operation so as to explain the principle of a semiconductor nonvolatile memory device of one embodiment of the present invention.

With reference to FIG. 1, the current characteristic (threshold characteristic) with respect to the word line voltage in the reading operation will be described as the principle of the semiconductor nonvolatile memory device of the present embodiment.

The semiconductor nonvolatile memory device of the embodiment is applied to a semiconductor nonvolatile memory device which is composed of transistors whose data can be electrically rewritten (erased programmed). A read-selected word line voltage is set at a potential between the word line voltages for verifying the threshold values in the two states of a memory cell, and a voltage lower than the supply voltage applied from the outside is applied to the semiconductor nonvolatile memory device.

Specifically, as shown in FIG. 1, a read-selected word line voltage Vrw lower than the supply voltage Vcc applied from the outside is applied, and the threshold voltage difference (VthH–VthL) between the higher threshold voltage VthH and the lower threshold voltage VthL of the two states of the memory cell is so reduced that the higher threshold voltage VthH approaches the lower threshold voltage VthL. Incidentally, the unselected word line voltage is set to 0 V (the ground voltage Vss).

In order to lower the rewrite operation voltage, a thermal voltage Vthi in the thermally equilibrium state of the memory cell, corresponding to the higher threshold voltage VthH and the lower threshold voltage VthL of the two states of the memory cell, is defined between the higher threshold voltage VthH and the lower threshold voltage VthL.

Figure 2:
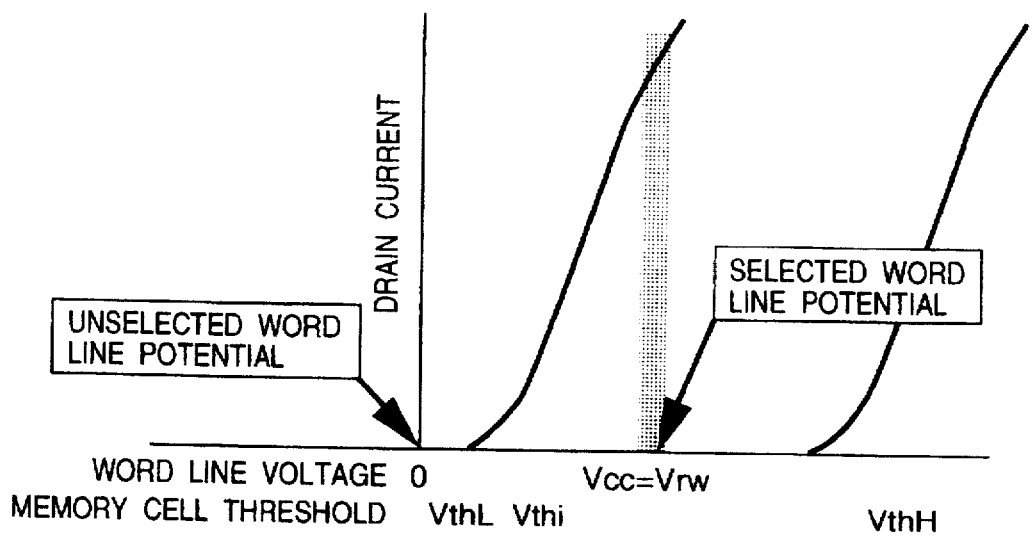
FIG. 2 is a characteristic diagram showing the current characteristic with respect to the word line voltage in reading of a comparative example which has been compared with the present embodiment by the inventor.

In the comparison example shown in FIG. 2, on the contrary, both the two states of the memory cell are over 0 V, and the read-selected word line voltage Vrw at this time is the supply voltage Vcc between the higher threshold voltage VthH and the lower threshold voltage VthL of the two states. In this comparison example, the threshold voltage difference (VthH–VthL) of the two states of the memory cell is made larger than that of FIG. 1, so that the higher threshold voltage VthH is far from the lower threshold voltage VthL.

Figure 16:
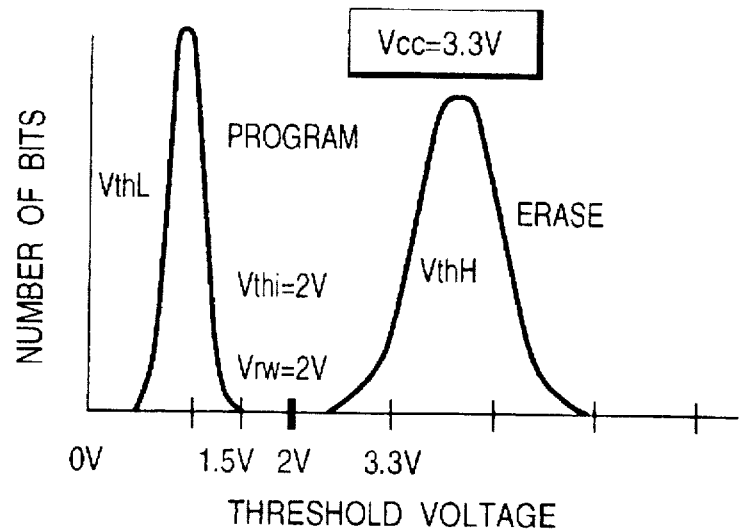
FIG. 16 is a characteristic diagram showing the number of bits with respect to the threshold voltage of the present embodiment.

In the characteristic representing the number of bits for the threshold voltage, corresponding to FIG. 1 showing the present embodiment, the read-selected word line voltage Vrw is set to the stabilized value of 2 V generated on the basis of the supply voltage Vcc (3.3 V) applied from the outside, as shown in FIG. 16, and the threshold voltage Vthi in the thermally equilibrium state of the memory cell is also set to the same value of 2 V as the read-selected word line voltage Vrw. The threshold voltage of the memory cell is lowered to VthL by performing a program operation, and raised to VthH by performing an erase operation. In the program operation, the threshold can be lowered bit by bit, so that the distribution of the lower threshold voltage VthL can be steepened even for a memory cell lowering threshold voltage is relatively slowly lowered, by increasing the write cycles and the write time.

In the embodiment, the migration of charge is reduced by bringing the characteristic waveform of the number of bits in the program operation and the erase operation to the read-selected word line voltage Vrw, and the read-selected word line voltage Vrw is equal to the threshold voltage Vthi in the thermally equilibrium state, so that the retention characteristic after the program operation and the erase operation can be improved.

Figure 17:
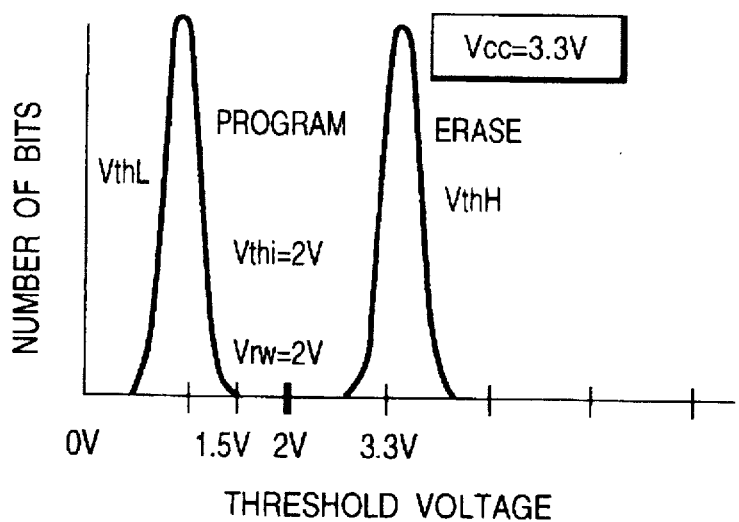
FIG. 17 is a characteristic diagram showing the number of bits with respect to another threshold voltage of the present embodiment.

Incidentally, in the characteristic representing the number of bits with respect to the threshold voltage, as shown in FIG. 16, the threshold voltage varies even though the numbers of bits to be programmed and erased are equal to each other, so that a memory cell whose threshold voltage is relatively slowly raised in the erase operation can be selectively erased to steepen the distribution of the higher threshold voltage VthH, as shown in FIG. 17. As a result, the variation of the threshold voltage can be eliminated in the nonvolatile memory device in which the number of memory cells to be programmed in the program operation and the number of memory cell to be erased in the erase operation are equal.

Figure 18:
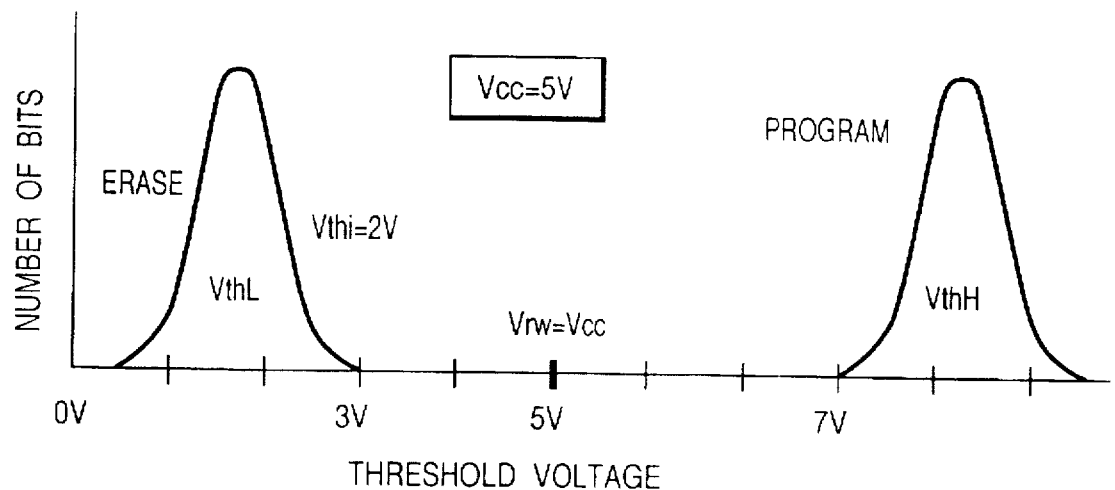
FIG. 18 is a characteristic diagram showing the number of bits with respect to a threshold voltage of an example compared with the present embodiment.

In the comparison example compared with the embodiment, for example, in the example of connection of memory cells by the NOR method, as shown in FIG. 18, the read-selected word line voltage Vrw is set to the supply voltage Vcc (5 V) applied from the outside, and the threshold voltage Vthi in the thermally equilibrium state of the memory cells is set to 2 V, different from the power voltage Vcc. In the data rewrite operation, the write operation sets the threshold of the memory cells to the higher threshold voltage VthH, and the erase operation sets the threshold of the memory cells to the lower threshold voltage VthL. In this case of the characteristic of FIG. 18, the number of bits to be erased is large. Specifically, in the erase operation, the number of memory cells in the block selected so as to be set to the lower threshold voltage is larger than that of the memory cells selected so as to be set to the lower threshold voltage, as shown in FIG. 16 or 17, so that the threshold voltage varies in FIG. 18.

Figure 19:
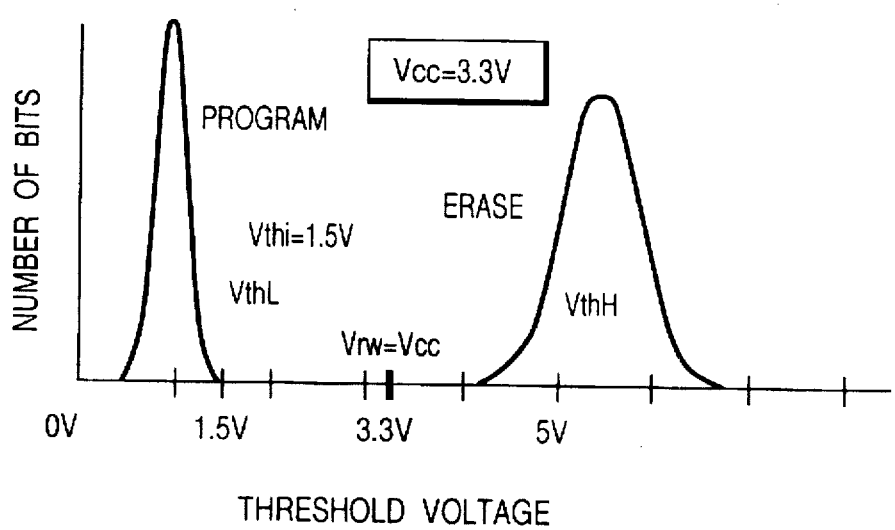
FIG. 19 is a characteristic diagram showing the number of bits with respect to another threshold voltage of the example compared with the present embodiment.

In an example of connection of the memory cells by the AND method, as shown as a comparison example in FIG. 19, the read-selected word line voltage Vrw is set to the supply voltage Vcc (3.3 V) applied from the outside, and the threshold voltage Vthi in the thermally equilibrium state of the memory cells is set to 1.5 V, different from the supply voltage Vcc, so that the program operation can be performed bit by bit. The threshold voltage of the programmed memory cells in which data have been written is set to the lower threshold voltage VthL, and the threshold voltage of the erased memory cells whose data have been erased is set to the higher threshold voltage VthH. In the case of the characteristic of FIG. 19, the distribution of the lower threshold voltage VthL and the distribution of the higher threshold voltage VthH are apart from each other.

Figure 3:
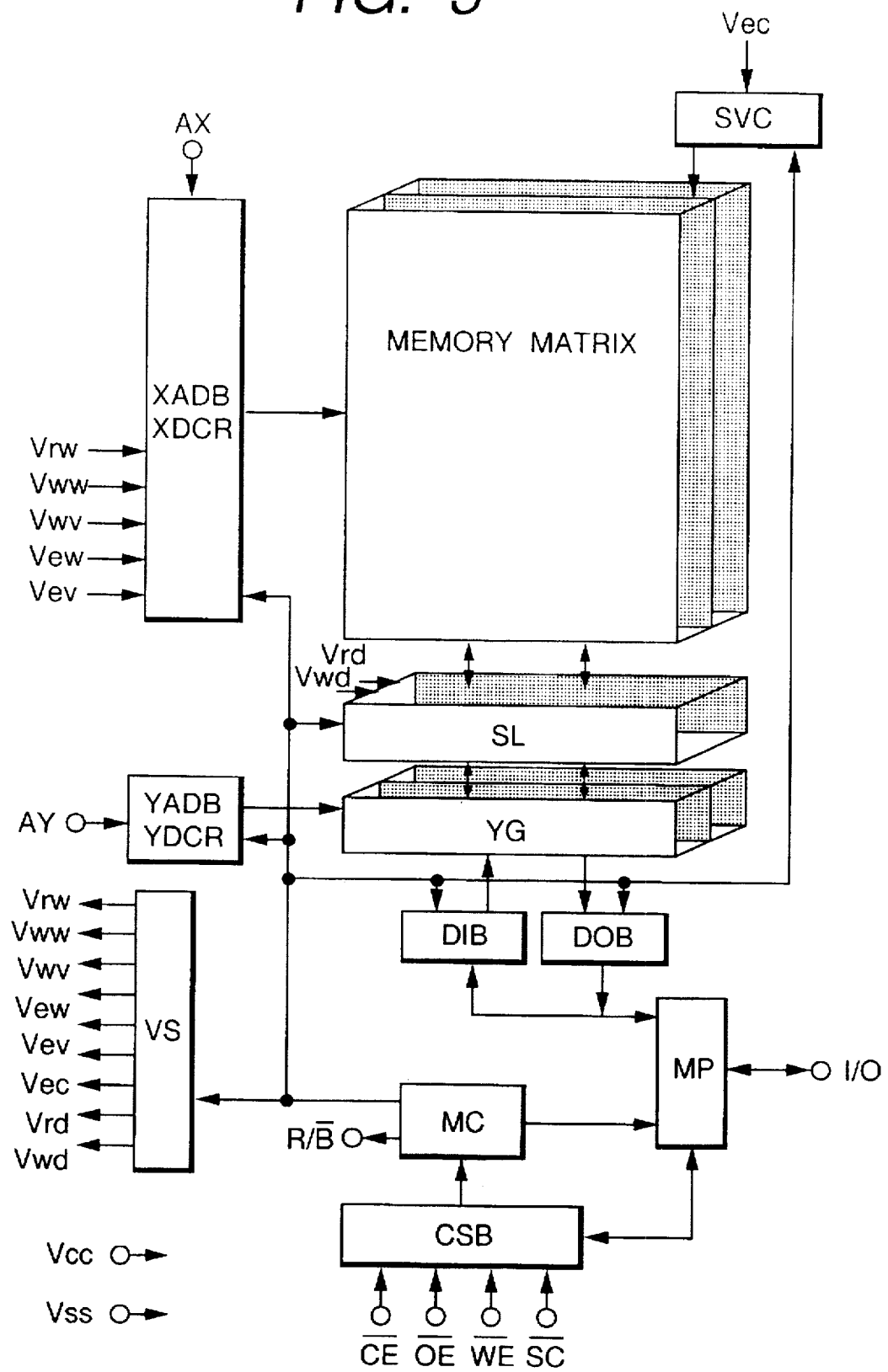
FIG. 3 is a functional block diagram showing the semiconductor nonvolatile memory device of the present embodiment.

Here will be described the construction of the semiconductor nonvolatile memory device of the embodiment. Incidentally, this semiconductor nonvolatile memory device is constructed of a plurality of memory mats, as shown in FIG. 3, although not especially limited thereto.

Specifically, the semiconductor nonvolatile memory device is constructed of a memory matrix Memory Matrix, a row address XADB, a row address decoder XDCR, a sense latch circuit SL, a column gate array circuit YG, a column address buffer YADB, a column address decoder YDCR, a source/channel potential switching circuit SVC, an input buffer circuit DIB, an output buffer circuit DOB, a multiplexer circuit MP, a mode control circuit MC, a control signal buffer circuit CSB and a packaged power supply circuit VS.

In this semiconductor nonvolatile memory device, moreover, the control signal buffer circuit CSB is fed with a chip enable signal, an output enable signal, a write enable signal and a serial clock signal from external terminals /CE, /OE, /WE and SC, although not especially limitative thereto. In response to the above signals, timing signals for the internal control signals are generated, and a ready/busy signals is outputted from the mode control circuit MC to an external terminal R/(/B). Incidentally, the symbol "/", used in the signals /CE, /OE and /WE of the embodiment, represents that the signals denoted by the symbols with "/" are complementary signals.

Moreover, the built-in power supply circuit VS is fed with the supply voltage Vcc from the outside, although not especially limitative thereto, to produce a read word line voltage Vrw, a write word line voltage Vww, a write verify word line voltage Vwv corresponding to the lower threshold voltage VthL, an erase word line voltage Vew, an erase verify word line voltage Vev corresponding to the higher threshold voltage VthH, an erase channel source voltage Vec, a read data line voltage Vrd and a write drain terminal terminal Vwd. Incidentally, the above-specified individual voltages may be fed from the outside.

Of the individual voltages thus generated: the read word line voltage Vrw, the write word line voltage Vww, the write verify word line voltage Vwv, the erase word line voltage Vew and the erase verify word line voltage Vev are inputted to the column address decoder XDCR; the erase channel/source voltage Vec is inputted to the source/channel potential switching circuit SVC; and the write drain terminal terminal Vwd is inputted to the sense latch circuit SL. The sense latch circuit is composed of: a flip-flop for sensing the memory cells and latching the rewrite data of the threshold voltages of the memory cells, for each bit line; and a circuit for resetting the data of the flip-flop automatically for each bit in accordance with the threshold states of the memory cells after verified.

In this semiconductor nonvolatile memory device, the complementary address signals, generated through the row and column address buffers XADB and YADB receiving row and column address signals AX and AY fed from the external terminals, are fed to the row and column address decoders XDCR and YDCR. Although not especially limitative thereto, moreover, the row and column address buffers XADB and YADB are activated by the chip enable select signals in the device to take in the address signals AX and AY from the external terminals and thereby to generate the complementary address signals which are composed of the internal address signals in phase with the address signals fed from the external terminals and address signals in antiphase therewith.

The row address decoder XDCR generates a selecting signal of the word lines WL of the memory cell group according to the complementary address signal of the row address buffer XADB, and the column address buffer YADB generates a selecting signal of the data line DL of the memory cell group according to the complementary address signal of the column address buffer YADB. As a result, in the memory matrix Memory Matrix, arbitrary word line WL and data line DL are designated to select the desired memory cell.

When the number of memory cells of one data block in the word line direction (row direction) is X, and that in the data line direction (column direction) is Y, although not especially limitative thereto, the data block of a group of X×Y memory cells is composed of eight or sixteen memory cells for a system bus width of 8 bits or 16 bits.

Here, an arbitrary memory cell is selected from the memory matrix Memory Matrix, and the operation of reading the data from the selected memory cell will be described with reference to FIGS. 20 to 23 for the cases in which the serial access method and the random access method are used for the memory cell. In the embodiment, an especially high effect can be expected by providing a sense latch circuit for latching data temporarily at the outputting time and by adopting the serial access method.

Figure 20:
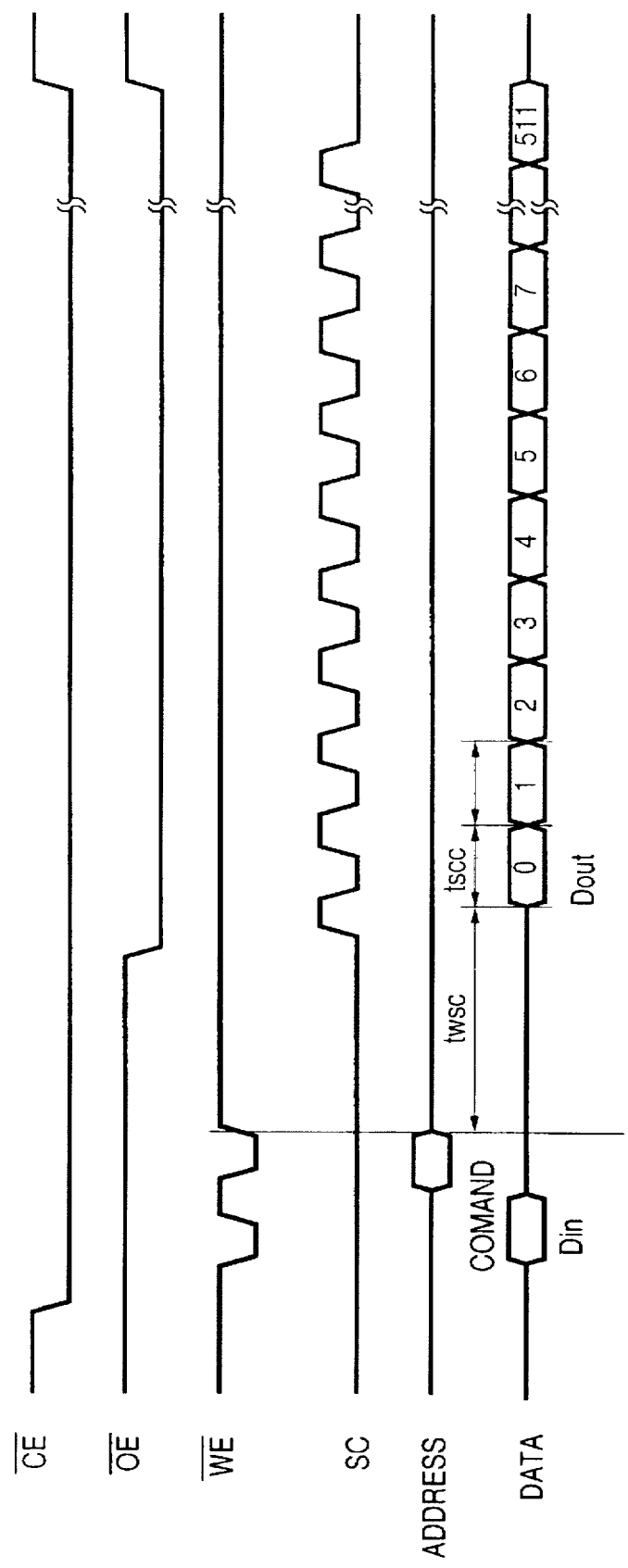
FIG. 20 is a timing chart showing a serial access method of the present embodiment.
Figure 21A:
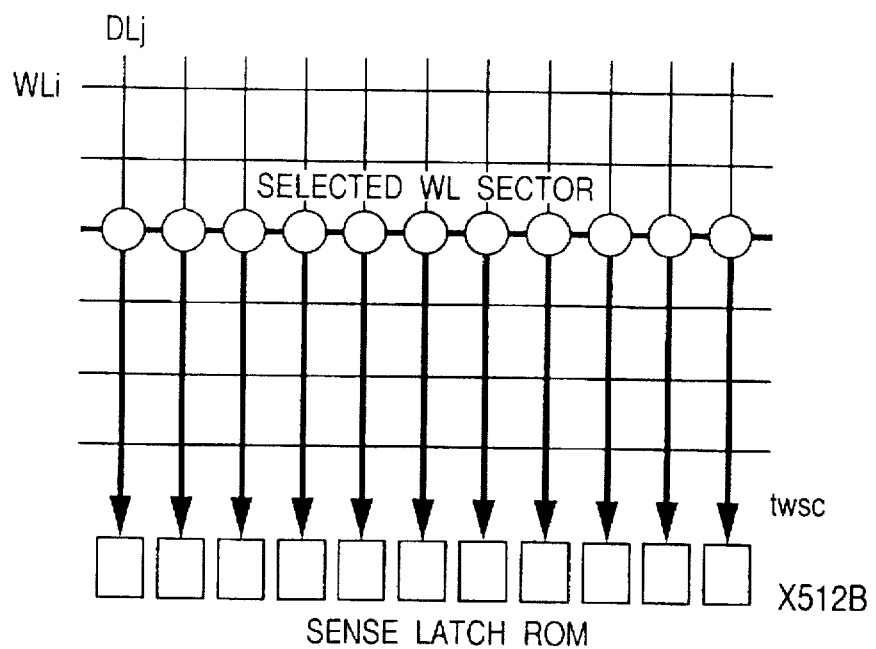
FIGS. 21(a) and 21(b) are explanatory diagrams schematically showing the data output in the serial access method of the present embodiment.
Figure 21B:
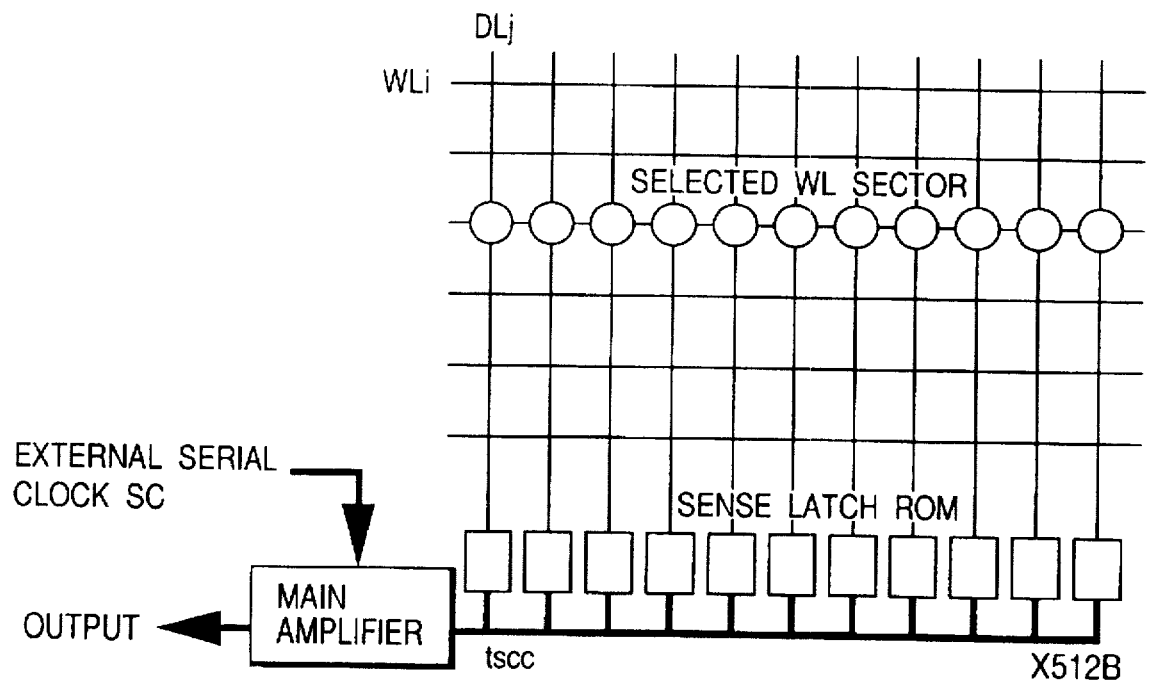

In the serial access method, for example, the operation is illustrated by the timing chart shown in FIG. 20, and the data are outputted, as shown in FIG. 21 showing a part of the memory matrix Memory Matrix schematically. Specifically, when the chip enable signal /CE, the output enable signal /OE and the write enable signal /WE are activated to input the address signal Address after the data input command Din, the address signals are sequentially incremented or decremented to output data Data of 512 bits, from 0 bit to 511 bit, in synchronism with the serial clock signal SC.

In this case, in the memory matrix Memory Matrix, as shown in FIG. 21($a$), one word line Wli is designated, and a data line DLj is sequentially designated, and the memory cells connected with the word line WLi and the data line DLj are sequentially selected, so that the data are latched by the sense latch circuit. Moreover, the data, latched by this sense latch circuit, are sequentially outputted through the main amplifier, as shown in FIG. 21($b$). For example, the time twsc till the first data are outputted after the input of the address signal Address can be 1 μm, and the time tscc taken to output one data can be 50 ns, so that the data can be read out at a high speed.

Figure 22:
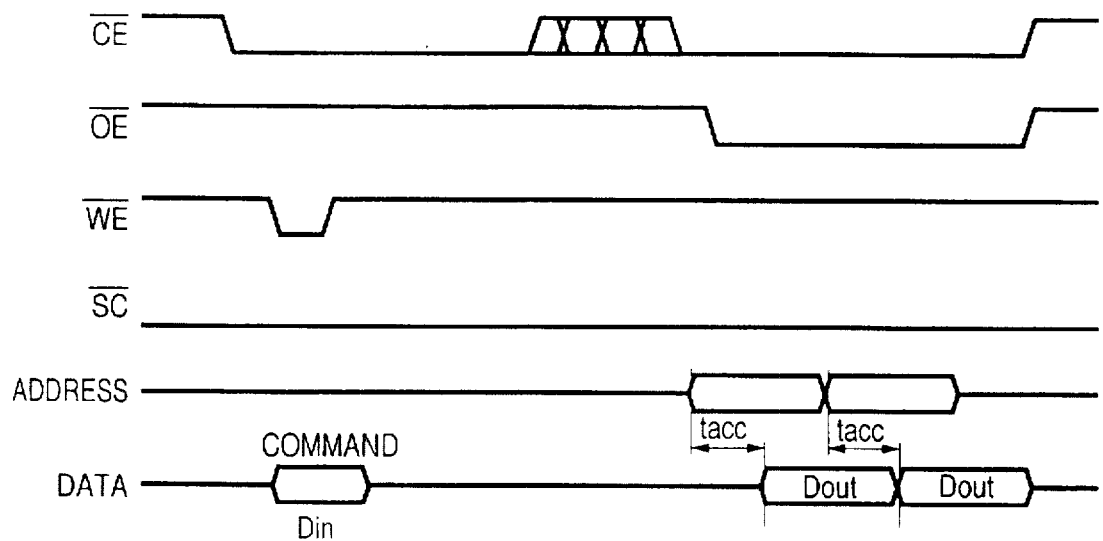
FIG. 22 is a timing chart showing a random access method of the example compared with the present embodiment.
Figure 23:
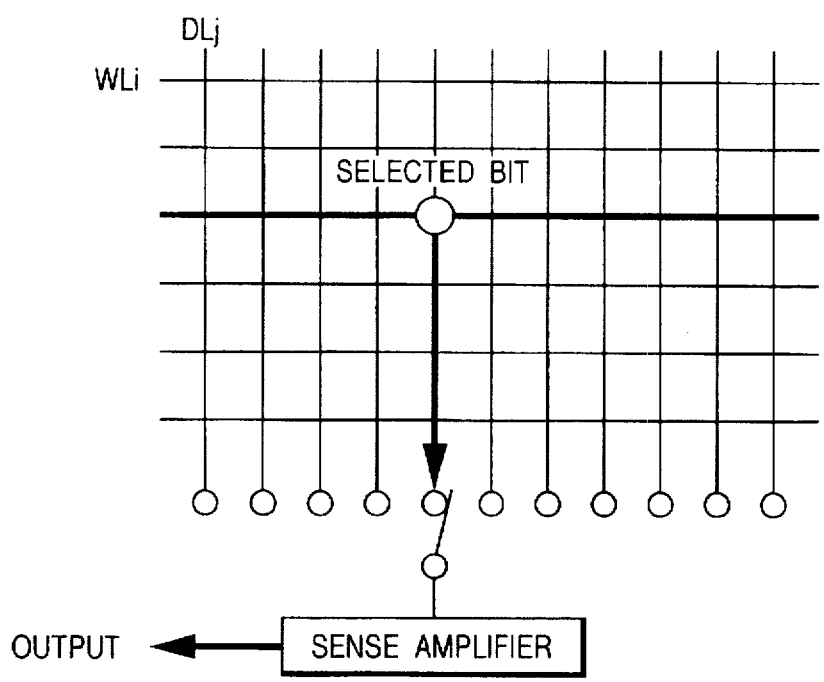
FIG. 23 is an explanatory diagram schematically showing the data output in the random access method of the example compared with the present embodiment.

In the random access method, on the other hand, the operation is illustrated by the timing chart shown in FIG. 22, and the data are outputted, as shown in FIG. 23 showing a part of the memory matrix Memory Matrix schematically. Specifically, when the first address signal Address is inputted, one word lien WLi and one data line DLj are designated in the memory matrix Memory Matrix, so that the memory cell connected with the word line WLi and the data line DLj is selected. Then, the data of the memory cell thus selected are outputted through the sense amplifier. For the next address signal Address, too, the data of the memory cell, selected by the word line WLi and the data line DLj, can be outputted a time tacc after the input of the address signal Address.

Incidentally, in the embodiment, the voltages generated by the built-in power supply circuit VS are different from the voltages of the prior art in that the read word line voltage Vrw is a drop voltage, e.g., 2.0 V with respect to the external supply voltage Vcc of the prior art, and in that the word line voltage Ver for verifying the higher threshold voltage of the memory cell is from 4.3 V to 2.8 V which is near the range, described in the specifications, of the external supply voltage Vcc. The built-in power supply voltage, which is lower than the external supply voltage Vcc, is generated by dividing the external supply voltage Vcc by a resistor or a MOS transistor, and the voltage, which is higher than the external supply voltage Vcc, is generated by using a booster pump circuit.

Figure 15:
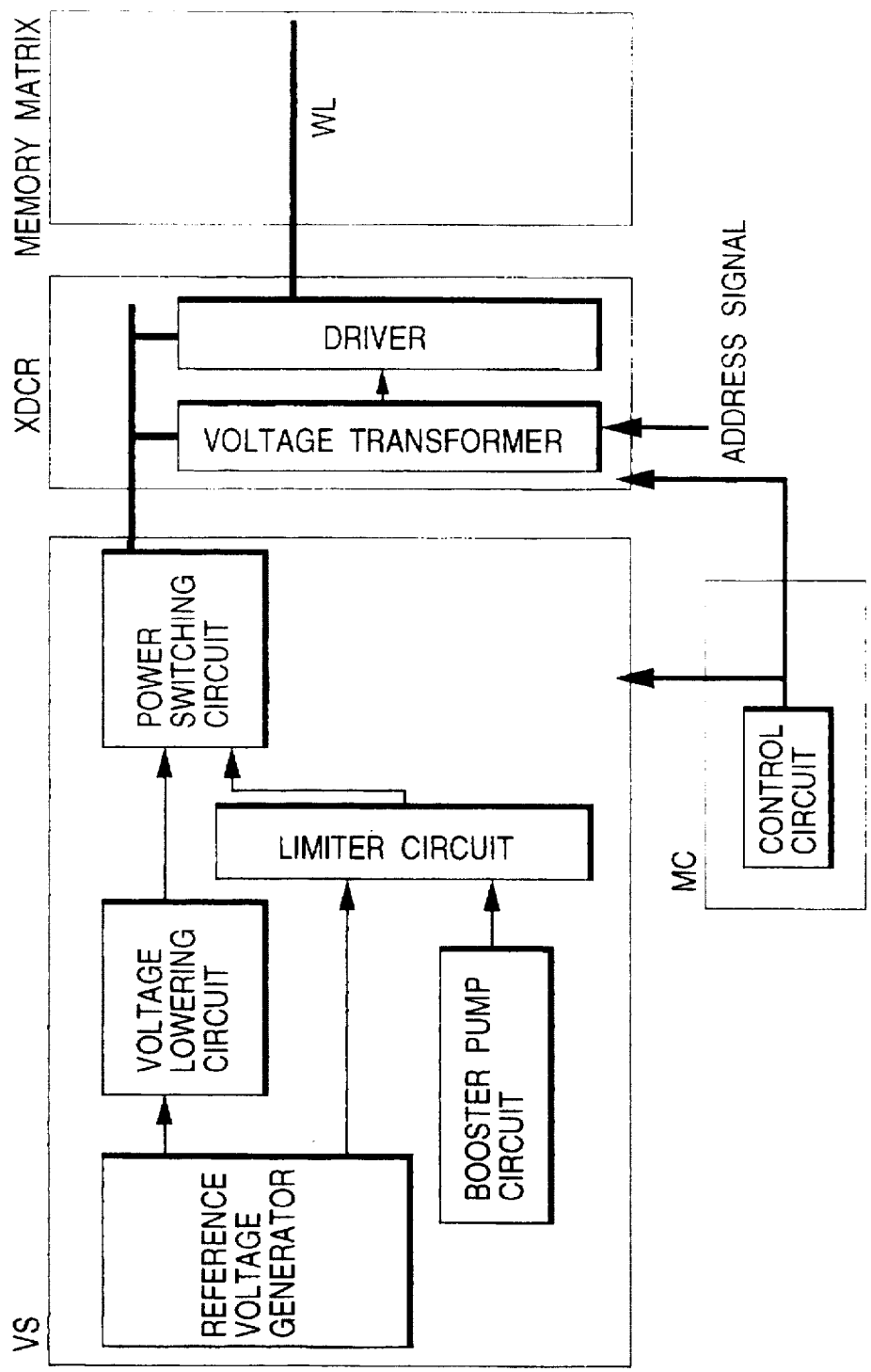
FIG. 15 is a functional block diagram for explaining the generation of the word line voltage of the present embodiment.

When an accuracy of the built-in power supply voltage is necessary, it is conceivable to use built-in power supply circuit VS having the block construction of FIG. 15. Specifically, the bult-in power supply circuit VS is constructed of a reference voltage generator, a voltage lowering circuit, a booster pump circuit, a limiter circuit and a power switching circuit. The output supply voltage is connected with both the power switching circuit in the row address decoder XDCR for selecting the word line WL and the driver, and controlled by the mode control circuit MC. In the generation of the read word line voltage Vrw, the voltage accuracy is improved by using the reference voltage of the reference voltage generator in the voltage lowering circuit comprising a current mirror circuit.

In the generation of the word line voltage Vev for verifying the higher threshold voltage of the memory cell, on the other hand, the voltage accuracy is improved by using the reference voltage of the reference voltage generator in the limiter circuit after the word line voltage Vev has been generated by the booster pump circuit. In the embodiment, however, the verify word line voltage Vev is close to the range, described in the specifications, of the external supply voltage Vcc, so that it is boosted after it has been reset to the ground voltage.

Figure 24:
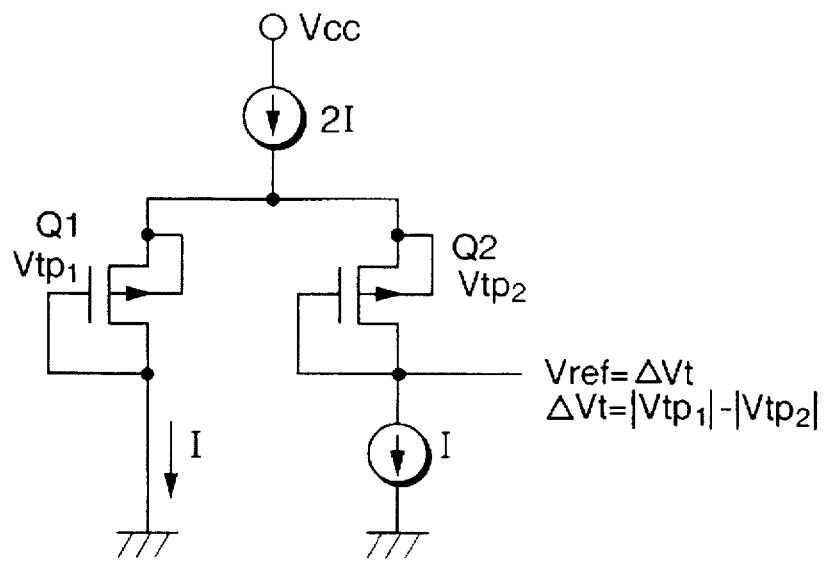
FIG. 24 is a circuit diagram showing a reference voltage generator of the present embodiment.

The reference voltage generator, constituting the built-in power supply circuit VS, can be constructed, as shown in FIG. 24, by using two P-channel MOS transistors Q1 and Q2 and by connecting the commonly connected sources with the external supply voltage Vcc through the current source and the drain with the ground potential through the current source. Specifically, this reference voltage generator is a reference voltage generator making use of the difference between the threshold voltages of the MOS transistors Q1 and Q2. The reference voltage generator has little dependence upon the external supply voltage Vcc and the temperature and is composed of the P-channel MOS transistors Q1 and Q2, the sources of which are not directly connected with the power source. Thus, the reference voltage generator is advantageous in that the reference voltage Vref is hardly influenced by the transient fluctuation of the reference potential and the supply voltage of the P-type substrate.

These two P-channel MOS transistors Q1 and Q2 are given the same size. The threshold voltage of one of the transistors $Q_1$ and $Q_2$ is set to a higher level than that of the other (|Vtp1|-|Vtp2|). When the MOS transistors Q1 and Q2 are fed with equal currents, a reference voltage Vref equal to |Vtp1|-|Vtp2| is produced because their sources are common. Since this reference voltage Vref is determined exclusively by the difference between the threshold voltages, the dependence upon the voltage Vcc and the temperature can be reduced to achieve a stable internal supply voltage.

Figure 25:
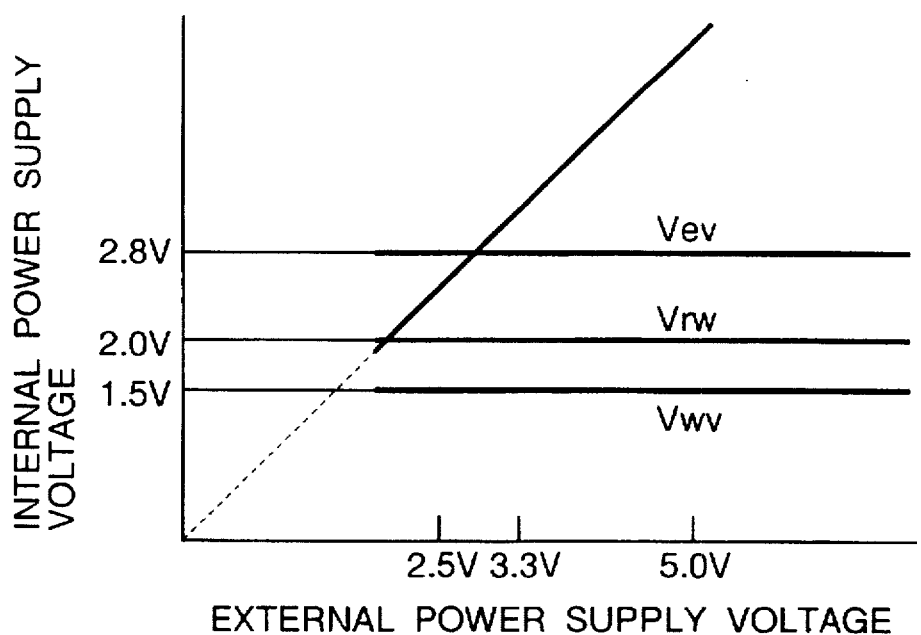
FIG. 25 is a characteristic diagram showing the internal power supply voltage with respect to the external supply voltage of the present embodiment.

For example, the relations between the external supply voltage Vcc and the internal power supply voltages generated by the reference voltage generator, such as the read word line voltage Vrw of 2.0 V, the erase verify word line voltage VeV of 2.8 V and the write verify word line voltage Vwv of 1.5 V are shown in FIG. 25. Any of the internal supply voltages Vrw, Vev and Vwv is not dependent upon the external supply voltage Vcc but constant even when the external supply voltage Vcc is 5 V or 3.3 V. It is therefore understood that the voltage applied to the word lines has no dependence upon the external supply voltage. Incidentally, other peripheral circuits may be connected with the external power supply voltage Vcc.

The aforementioned memory cells has a construction similar to that of the memory cells of the EPROM, although not especially limitative thereto, and include well-known memory cells having control gates and floating gates, and well-known memory cells having control gates, floating gates and select gates. Here will be described the structure of the memory cell having a control gate and a floating gate with reference to FIG. 4.

Figure 4:
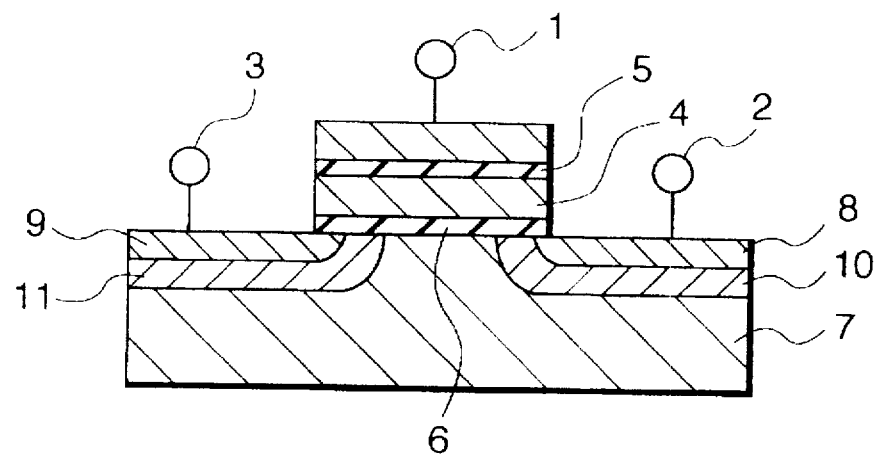
FIG. 4 is a section of a transistor of a semiconductor nonvolatile memory cell of the present embodiment.

In FIG. 4, this nonvolatile memory cell has the same structure as that of the transistor of the memory cell of the flash memory, published on pp. 560 to 563, "International Electron Devices Meeting Tech. Dig.", 1987. This memory cell is formed over a semiconductor substrate made of P-type single crystal silicon, although not especially limitative thereto.

Specifically, this nonvolatile memory cell is an EEPROM cell of flash erase type composed of one transistor element which is composed of a control gate electrode 1, a drain electrode 2, a source electrode 3, a floating gate 4, an interlayer insulating film 5, a tunnel insulating film 6, a P-type substrate 7, heavily doped N-type diffusion layers 8 and 9 in the drain/source regions, a lightly doped N-type diffusion layer 10 on the drain side, and a lightly doped P-type diffusion layer 11 on the source side.

Figure 26:
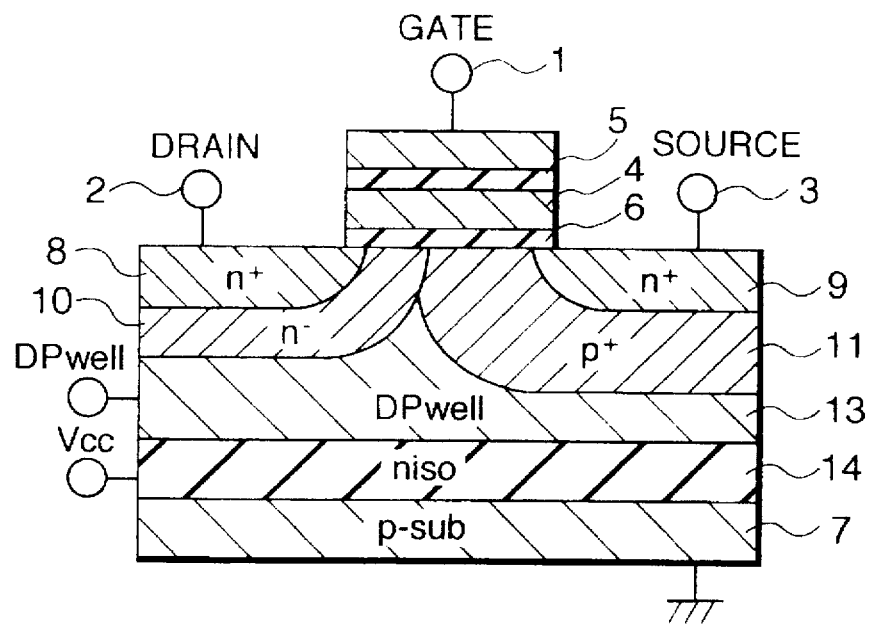
FIG. 26 is a section of a transistor of another semiconductor nonvolatile memory cell of the present embodiment.

In order that a negative voltage may be applied to a well region 13 for forming the memory cell thereby to lower the erase operation voltage, i.e., the voltage applied to the control gate electrode, a structure shown in FIG. 26 is conceivable as an example. Specifically, in this structure the spacing between the heavily doped N-type diffusion layers 8 and 9 in the drain/source regions is narrow, and the D (depression) P-type well region 13 and an N-type isolation layer 14 for isolating the DP type well region 13 and the P-type substrate 7, between the lightly doped N-type diffusion layer 10 or P-type diffusion layer 11 on the drain or source side and the P-type substrate 7 are formed in multi-layer.

The rewrite (erase, program) and read operations of the memory cell of FIG. 26 are executed, as shown in FIG. 27, in the case of the connection example of the memory cell by the AND method, by applying a voltage Vg of +14 V to the control gate electrode 1, a voltage Vs of −2 V to the source electrode 3, an open voltage Vd to the drain electrode 2, and a voltage Vw of −2 V to the DP type well region 13, so that the electrons can be injected (the threshold voltage increases) into the floating gate 4. For the potential of the N-type isolation layer 14, the power supply voltage Vcc is applied to divide the DP type well region 13 and the P-type substrate 7. However, the potential of the N-type isolation layer 14 may be the ground potential Vss.

In the program operation mode, on the other hand, as shown in FIG. 27(b), the electrons can be released (the threshold voltage decrease) from the floating gate 4 by setting the voltage Vg applied to the control gate electrode 1, to −9 V, the voltage Vd applied to the drain electrode 2, to +5 V when the cell is selected and 0 V when not selected, the voltage Vs applied to the source electrode 3, to an open value, and the voltage Vw of the DP type well region 13 to 0 V.

In the read operation mode, moreover, as shown in FIG. 27(c), the threshold voltage of the floating gate 4 can be outputted by setting the voltage Vg applied to the control gate electrode 1, to 2.0 V, the voltage Vd applied to the drain electrode 2, to +1 V, the voltage Vs applied to the source electrode 3, to 0 V, and the voltage Vw of the DP type well region 13 to 0 V.

Figure 28:
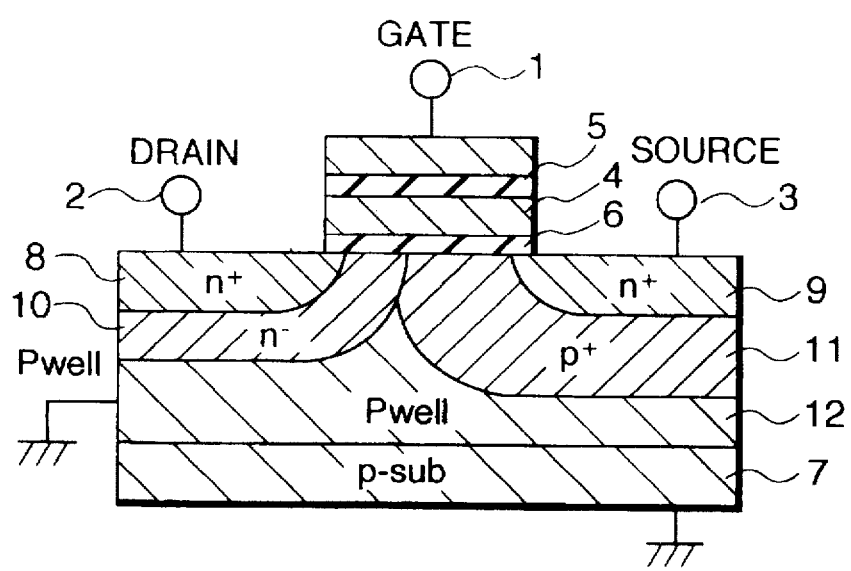
FIG. 28 is a section of a transistor of still another semiconductor nonvolatile memory cell of the present embodiment.

In a structure for voltage division to lower the erase operation voltage, on the other hand, as shown in FIG. 28, the spacing between the heavily doped N-type diffusion layers 8 and 9 for the drain/source regions is narrow and only a P-type well region 12 is formed between the lightly doped N-type diffusion layer 10 or P-type diffusion layer 11 on the drain or source side and the P-type substrate 7.

In this memory cell structure, the drain side lightly doped N-type diffusion layer 10 acts to retain the drain breakdown voltage, and the source side lightly doped N-type diffusion layer 11 serves to prevent the punch-through and to control the intrinsic threshold voltage Vthi. Incidentally, in the control of this intrinsic threshold voltage Vthi, this voltage Vthi may be controlled by the channel implantation below the floating gate 4 independently of the source side lightly doped N-type diffusion layer 11. The intrinsic threshold voltage Vthi is a threshold voltage in the thermally equilibrium state and when exposed to ultraviolet rays.

In the case of the (batch) erase operation mode of the memory cell of FIG. 28, the electrons can be injected into the floating gate 4 (the threshold voltage increase), as shown in Fig. (a), by setting the voltage Vg applied to the control gate electrode 1, to +16 V, the voltage Vs applied to the source electrode 3, to the voltage Vss, the voltage Vd applied to the drain electrode 2, to an open voltage, and the voltage Vw of the P-type well region 12 to the voltage Vss.

When the operation of raising the threshold voltage is in the program operation mode, on the other hand, the electrons can be injected into the floating gate 4, as shown FIG. 29(b), by setting the voltage Vg applied to the control gate 1, to +16 V, the voltage Vd applied to the drain electrode 2, to 0 V when the cell is selected and to +8 V when not selected, the voltage Vs applied to the source electrode 3 to an open value, and the voltage Vw of the P-type well region 12 to the voltage Vss.

A variety of examples of connection of the memory cell group in which a plurality of memory cells are connected, such as the NOR method, the DINOR method, the AND method and the HICR method, as will be sequentially described with reference to FIGS. 5 to 8, although not especially limitative thereto. Incidentally, the present invention should not be limited to the aforementioned ones but can be applied to other connection methods such as the NAND method.

Figure 5:
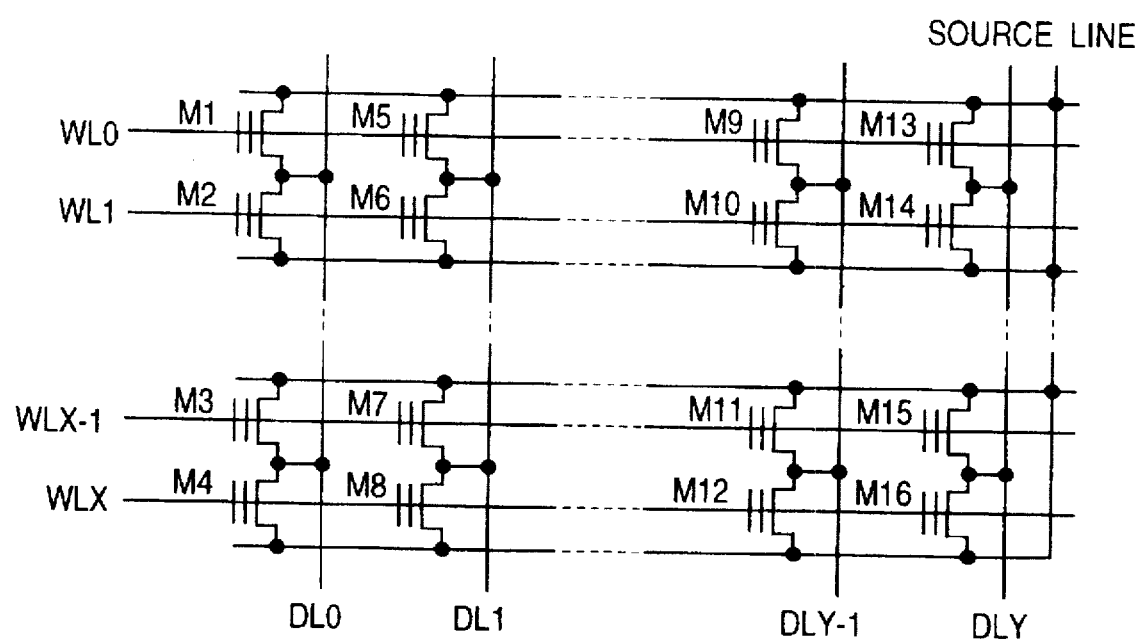
FIG. 5 is a circuit diagram showing an example of connection (NOR) of memory cells constituting a memory matrix of the present embodiment.

FIG. 5 shows an example, in which memory cells are connected by the NOR method. The MOS transistor of the memory cell is connected with word lines WL0 to WLX, data lines DL0 to DLY and a Source Line, through which the rewrite (program, erase) operation and the read operation are executed. Specifically, the word lines WL0 to WLX are connected with the gates of the MOS transistors; the data lines DL0 to DLY are connected with the drains of the MOS transistors; and the Source Line is connected with the sources of the MOS transistors.

Figure 6:
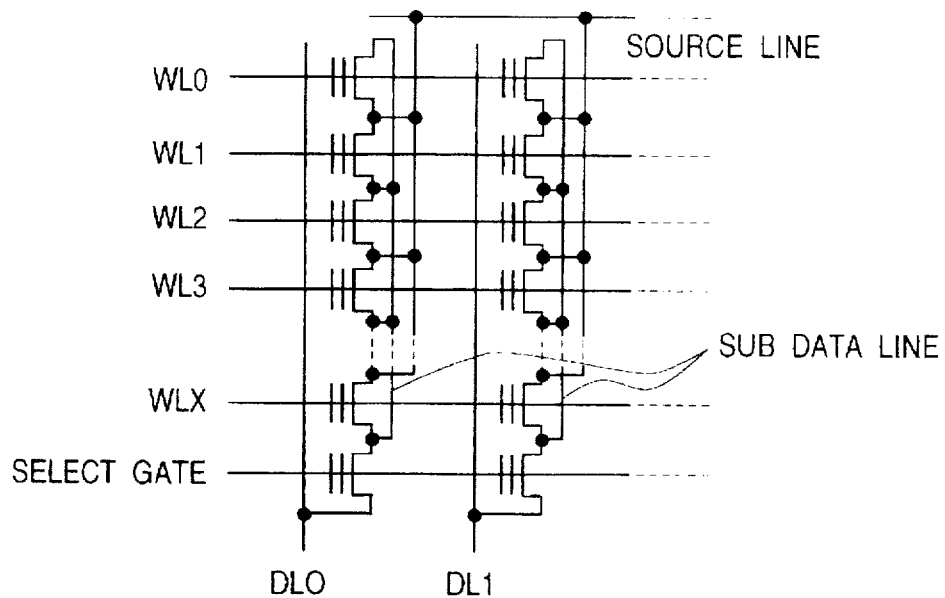
FIG. 6 is a circuit diagram showing an example of connection (DINOR) of memory cells constituting a memory matrix of the present embodiment.

FIG. 6 shows an example of connection of the memory cells by the DINOR method. There are added a Select Gate and a Sub Data Line. The sources of the MOS transistors of the Select Gate are connected with the data lines DL0 to DLY, and the drains of the MOS transistors are connected through the Sub Data Line with the drains of the MOS transistors of the individual memory cells.

Figure 7:
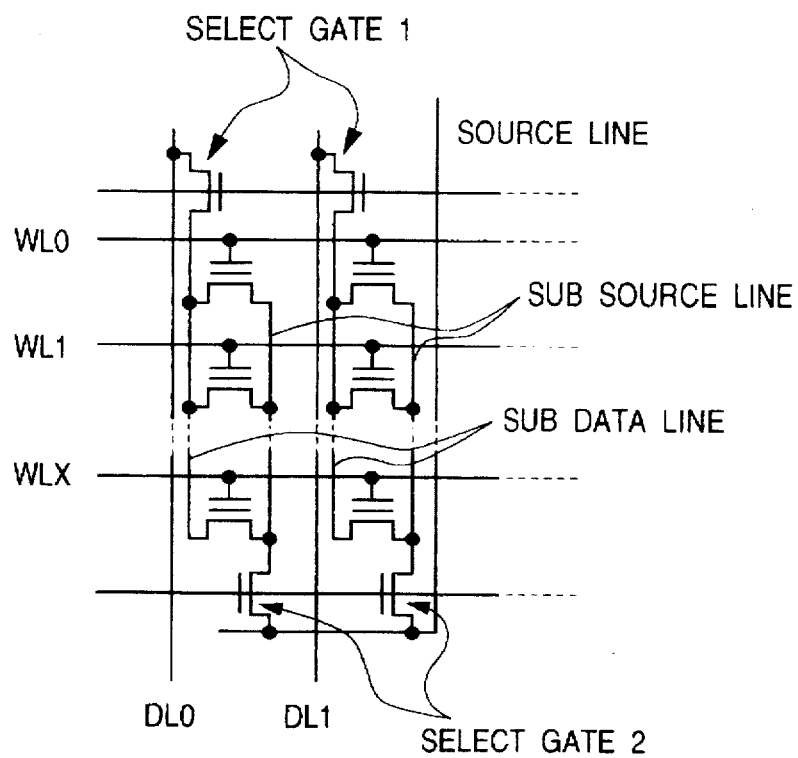
FIG. 7 is a circuit diagram showing an example of connection (AND) of memory cells constituting a memory matrix of the present embodiment.

FIG. 7 shows an example of connection by the AND method. This example includes a Select Gate1, a Select Gate2 and further a Sub Source Line. The sources of the MOS transistors of the Select Gate1 are connected with the data lines DL0 to DLY, and the drains of the MOS transistors are connected through the Sub Data Line with the drains of the MOS transistors of the individual memory cells. Moreover, the sources of the MOS transistors of the Select Gate2 are connected with the Source Line, and the drains of the MOS transistors are connected through the Sub Source Line with the sources of the MOS transistors of the individual memory cells.

Figure 8:
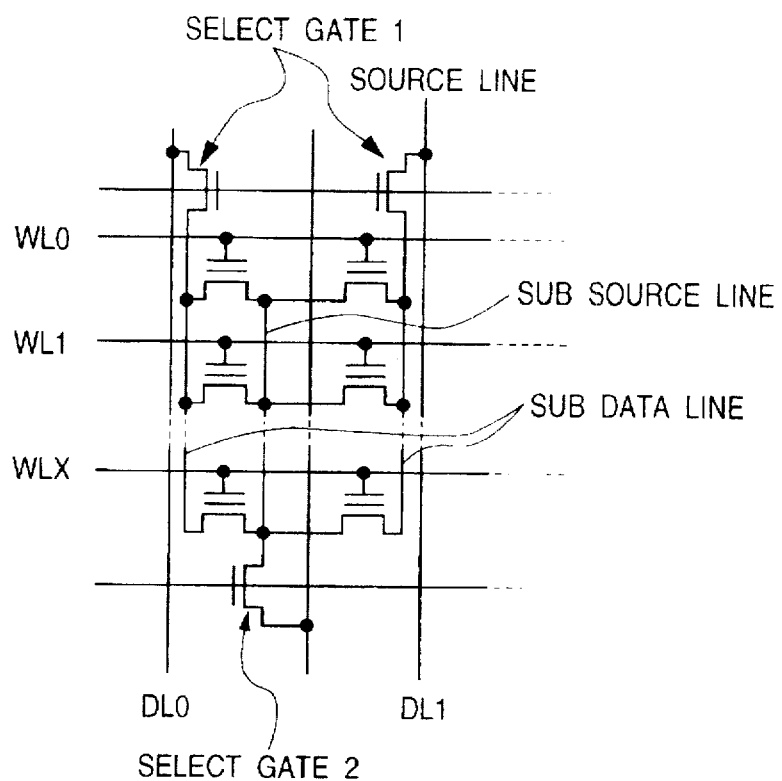
FIG. 8 is a circuit diagram showing an example of connection (HICR) of memory cells constituting a memory matrix of the present embodiment.

FIG. 8 shows an example of connection by the HICR method, in which the sources of the MOS transistors of the Select Gate1 are connected with the data lines DL0 to DLY whereas the drains of the MOS transistors are connected through the Sub Data Line with the drains of the MOS transistors of the individual memory cells. Moreover, the sources of the MOS transistors of the Select Gate2 are connected with the Source Line, and the drains of the MOS transistors are connected through the Sub Source Line with the sources of the MOS transistors of the individual memory cells.

In the NOR connection method of FIG. 5, more specifically, the construction is made up of the memory cell MOS transistors M1 to M16, the word lines WL0 to WLX, the data lines DL0 to DLY and the common Source Line. The potential of the Source Line is switched by the source/channel potential switching circuit SVC. In the memory cell group of FIG. 5, the control gates of the memory cells, arranged in the same row, such as the memory cells M1, M5, - - -, and M13 are connected with the common word line WL0, and the drains of the memory cells, arranged in the same column, such as the memory cells M1, M2, - - -, and M4 are connected with the common data line DL0.

The data lines DL0 to DLY are connected with the common Data Line through a column selecting switch which receives the selecting signal generated by the aforementioned column address decoder YDCR. Connected with the Data Line is the external terminal of the write data input buffer circuit DIB which receives the write signal inputted from the external terminal I/O through the multiplexer circuit MP, by way of the switch MOS transistor which receives the write control signal to be turned on at the writing time. At this writing time, the supply voltage inputted to the input buffer circuit DIB is the drain terminal voltage of the memory cells.

The common Data Line is coupled to a data register & sense amplifier common circuit DR&SA through the switch MOS transistors, which receives the read control signal to be turned on at the reading time, and connected with the external terminal I/O through the read data output buffer circuit DOB and the multiplexer circuit MP. For every data lines DL0 to DLY, moreover, the sense latch circuit SL may be connected to the common Data Line through the column select switch MOS transistors.

Since electrons are stored in the floating gate of the memory cell having a high threshold, no drain current does not flow even if the selecting potential is fed to the control gate or the word line WL. On the other hand, the memory cell in which no electron is injected into the floating gate has a low threshold so that the current flows, when the selecting potential is fed to the word line WL. By reading the drain current by the sense latch circuit SL, the level of the threshold of the memory cell is used as the information of the memory device.

The operation modes such as the read operation mode and the rewrite operation mode (erase operation mode and program operation mode) are effected by activating the chip enable signal and the write enable signal of the external terminals /CE and /WE and by inputting a command of the data of the external terminal I/O such as the read operation 00H, the erase operation 20H or the program operation 10H. In this case, the internal signals necessary for the individual operations are generated in the control signal buffer circuit CSB.

Moreover, it can be known from the outside by the status polling or the ready/busy signal whether or not the operation is the rewrite operation, whether or not the rewrite operation has ended, whether or not the operation is the erase operation and whether or not the operation is the write operation.

For the continuous read operation in units of a sector and the reception of the program data (sector data) in units of a sector, data may be outputted and inputted in synchronism with the signal coming from the external terminal SC.

In the read operation, the word line WL and the data line DL which are connected with the memory cell to be read are selected.

Thus, the desired memory cell is selected by the arbitrary word line WL and data line DL in the memory matrix Memory Matrix and is subjected to the rewrite operation by the program or erase operation and to the read operation.

Figure 32:
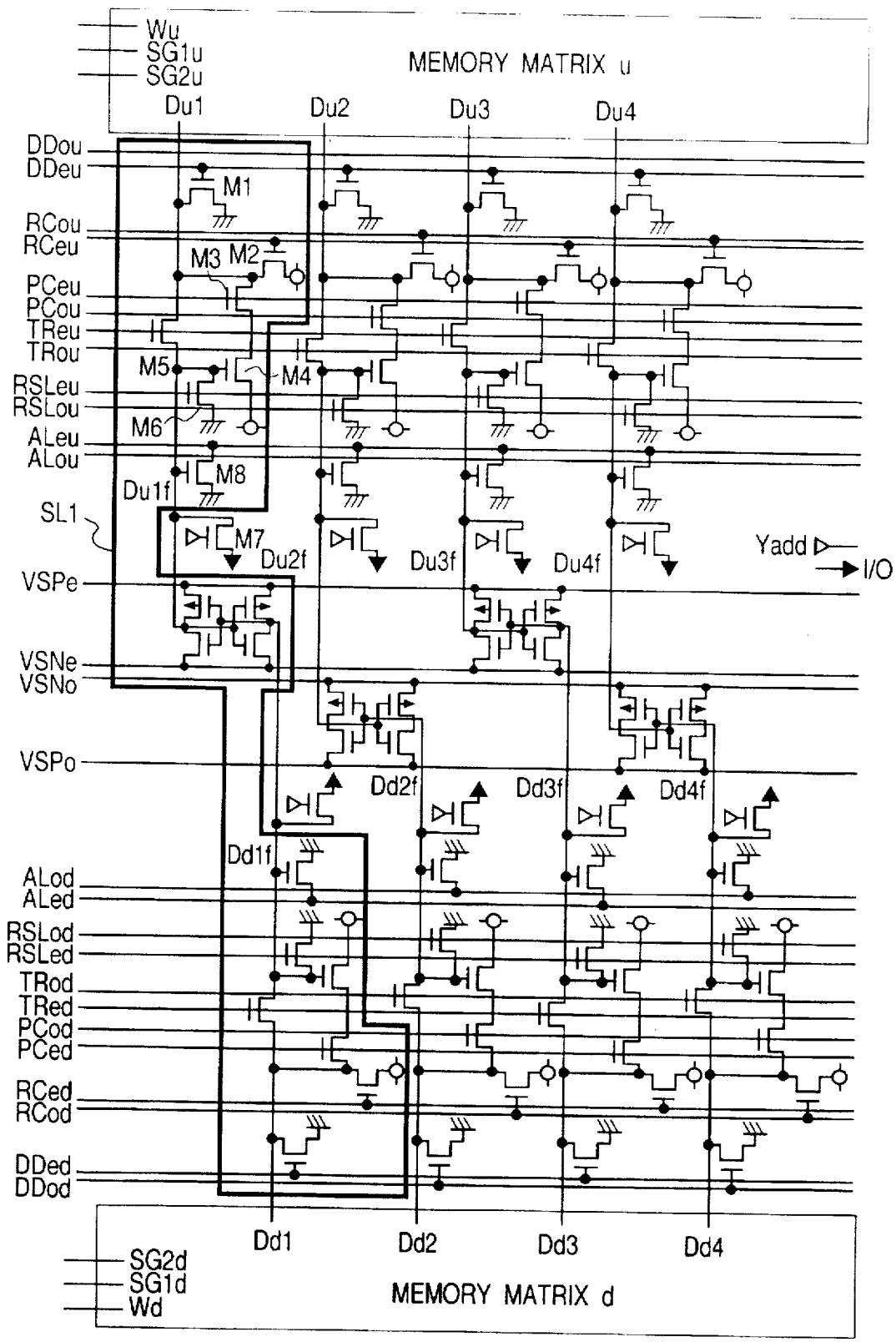
FIG. 32 is a circuit diagram showing a part of the memory matrix in detail of the present embodiment.

The data of the flip-flop in the sense latch circuit of the sequence of operation of lowering and raising the threshold voltage of the memory cells of the embodiment will be described with reference to FIGS. 30 and 31, and the timing waveform for operating the sense latch circuit of FIG. 32 will be described with reference to FIGS. 33 and 34. FIG. 32 shows a part of the memory matrix Memory Matrix in detail, and this memory matrix Memory Matrix of this embodiment is constructed by the open bit line method. Incidentally, the present invention could also be applied to the folded data line method.

The construction of FIG. 32 by this open bit line method is such that the memory matrix Memory Matrix corresponding to FIG. 3 is divided into two blocks on the u and d sides and has the sense latch circuit SL connected to the data lines Du/d in each block. The circuits, composed of the MOS transistors constituting the sense latch circuit SL, are arranged symmetrically on the u side and on the d side with respect to the sense latch, corresponding to the sense latch circuit SL and the column gate array circuit YG of FIG. 3. Incidentally, only the sense latch circuit SL1 is surrounded by a solid line in FIG. 32, by way of example.

The data "0" of the flip-flop of the sense latch circuit SL, as shown in FIGS. 30 and 31, is defined as the threshold voltage for the state in which the threshold voltage of the memory cell connected with the flip-flop is high, and the data of the flip-flop are at the ground potential Vss. Moreover, the data "1" of the flip-flop is defined as the threshold voltage for the state in which the threshold voltage of the memory cell is low. The data of the flip-flop are, for example, at the external supply voltage Vcc, and at the drain terminal voltage of the internal boosted potential at the rewriting time.

Figure 33:
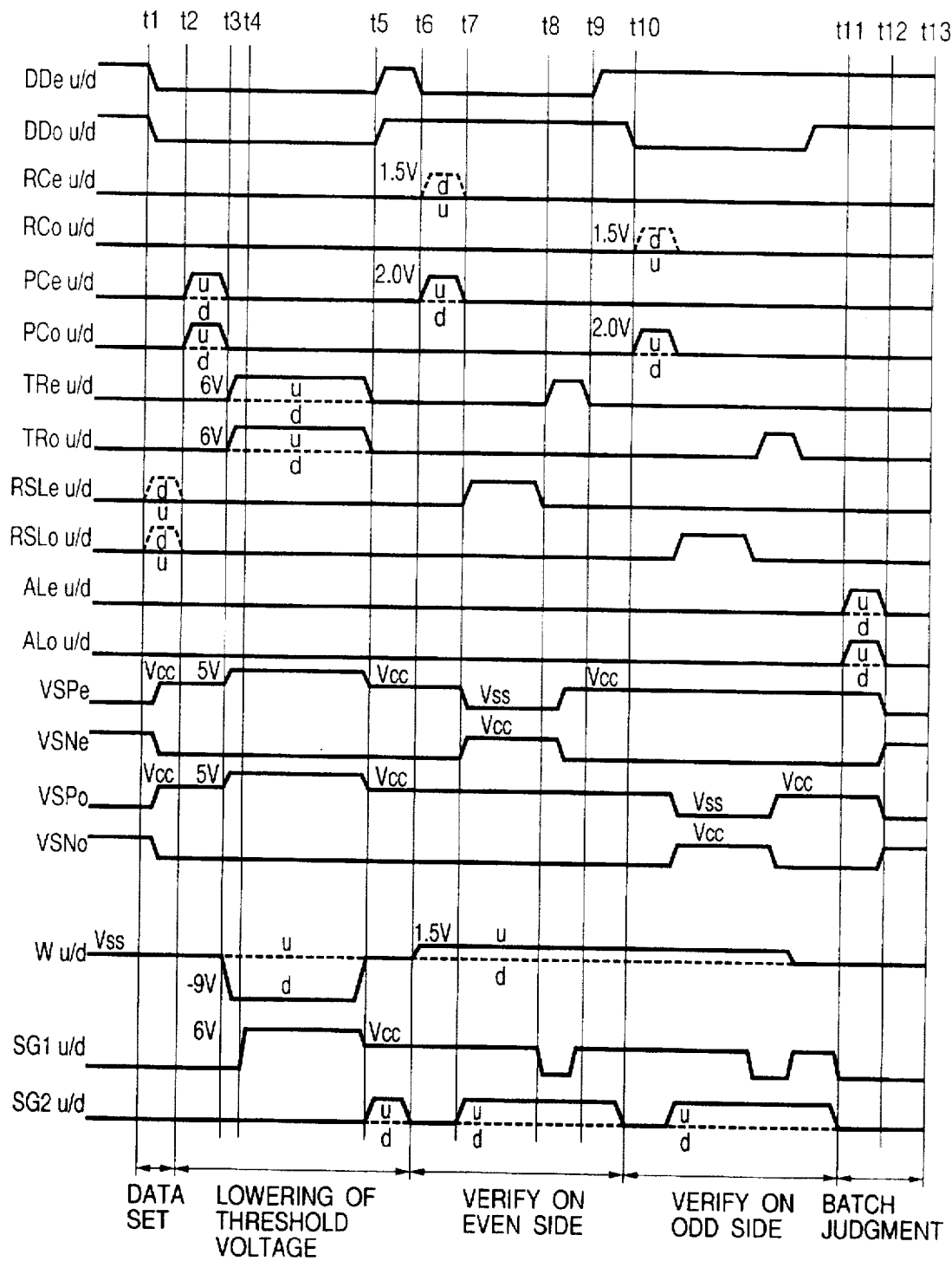
FIG. 33 is a timing chart showing an operation of lowering the threshold voltage of the memory cell of the present embodiment.
Figure 34:
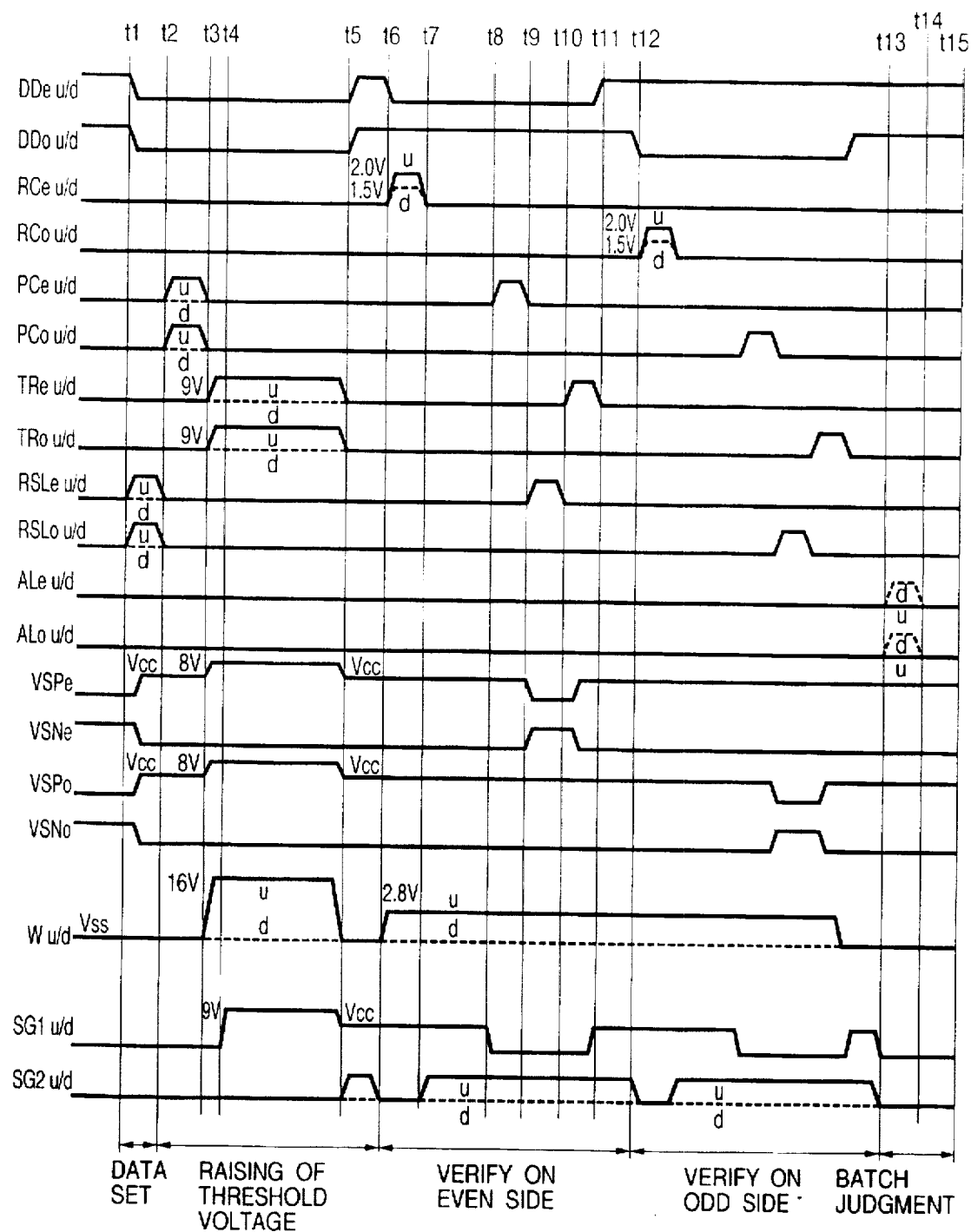
FIG. 34 is a timing chart showing an operation of raising the threshold voltage of the memory cell of the present embodiment.

In the timing waveforms of FIGS. 33 and 34, the memory cell group (or sector) on the u side of the memory matrix Memory Matrix is selected, and the waveforms of a solid line shows the signals on the u side whereas the broken line waveforms shows the signals on the d side. Moreover, the memory cells constituting the memory matrix Memory Matrix are connected by the AND method, as shown in FIG. 7. In the description of operations, on the other hand, the data lines are divided into even and odd ones so as to perform the verification. The operations should not be limited thereto but the even and odd data lines may be simultaneously verified.

First of all, the sequence of operation of lowering the threshold voltage of the memory cells will be described with reference to FIG. 30. When the operation is the program operation, data are inputted so that the flip-flop in the sense latch circuit SL, corresponding to the bits connected with the memory cells to be retained at the higher threshold voltage (the erase state), is set to "0" whereas the flip-flop connected with the memory cell to be rewritten to the lower threshold voltage (or selectively written) is set to "1". In the case of the erase operation, all the data are set to "1".

After this, the rewrite operation is executed to extract the charge in the floating gate to the drain region by the Fowler-Nordheim tunnel phenomenon. In the verification, the voltage of the selected word line is set to 1.5 V, for example, and only the data line corresponding to the data "1" of the flip-flop to be rewritten is selectively precharged. A cell current flows in the memory cell which has reached the rewrite threshold voltage level, i.e., the verify word line voltage of 1.5 V, to establish the Pass state in which the potential of the data lines is discharged. As a result, the data of the flip-flop are rewritten to "0".

In the memory cell not having reached 1.5 V, on the other hand, no cell current flows to establish the Fail state in which the potential of the data lines is held at the precharged voltage to hold the data "1" of the flip-flop. The data of the flip-flop, after verified, are used as the data to be rewritten, so that the rewrite and verify operations are repeated. The operation of lowering the threshold voltage is ended when all the data of the flip-flop take the value "0". This batch judgment is automatically accomplished in the chip.

FIG. 33 shows the timing waveforms for operating the sense latch circuit SL during the operation of lowering the threshold voltage of the memory cells.

The data of the flip-flop are defined till t2; the threshold voltage is lowered for the period from t2 to t6; the even side is verified from t6 to t10; the odd side is verified from t10 to t11; and the ends of all bits of the memory cell threshold voltage are determined from t11 to t13.

In the case of the erase operation of lowering the threshold voltage, the data of the flip-flop are set in the wholly selected state for the period from t1 to t2 by selecting the RSLed and RSLod on the unselected side and by activating the supply voltages VSPe/o and VSNe/o of the flip-flop. In the case of the program operation of lowering the threshold voltage, moreover, the write data are inputted till t1 to the flip-flop constituting the sense latch circuit SL, and the time period from t1 to t2 is skipped to the timing waveform from t2.

For the time period from t2 to t3, the data of the flip-flop are selectively transmitted from the data line D1 to Dn by selecting PCeu and PCou. For the subsequent time period from t3 to t5, the rewrite drain voltage is fed by selecting TReu and TRou. The reason why the PCeu and PCou are selected before the TReu and TRou is as follows. If only the TReu and TRou are selected, the data of the flip-flop are broken because the capacity of the data lines Du1 to Dun is larger than that of the Dulf to Dunf on the flip-flop side.

The reason why the potentials of the TReu, TRou and SG1a/b are set to 6 V is that it is necessary to transfer the drain terminal voltage 5 V (or VSPe and VSPo) at the operation time of lowering the threshold voltage. When the drain voltage is to be raised, the gate potentials of the TReu and TRou and a gate signal SG1u/d are determined considering the threshold voltages of the MOS transistors of the drain side Select Gate1. of the TReu, TRou and SG1u/d.

The SG1u/d is selected (at t4) after the potential of the selected word line voltage Wu has been lowered (at t3), because the delay time of the word lines is longer than that of the drain side Select Gate1. The net rewrite time period is from t4 to t5, and an electric field is created in the floating gate of a desired memory cell to release the electrons by setting the word lines at a negative voltage of −9 V to set the data line voltage selectively to 5 V.

For the time period from t5 to t6, selected are the potentials of the data lines Du1 to Dun, the signals DDeu/d and DDou/d for discharging the sub data line Sub Data Line and the sub source line Sub Source Line to the ground voltage Vss, the gate signal SG1u/d of the drain side Select Gate1 and the gate signal SG2u/d of the source side Select Gate2.

For the time period from t6 to t7, the signals PCeu and RCed are selected so as to precharge the data lines selectively with the data of the flip-flop and to feed the reference potential to the data lines on the d side of the memory matrix Memory Matrix on the unselected side. Taking the threshold voltage of the MOS transistors into consideration, the potential of the PCeu is 2.0 V for the precharge potential of 1.0 V, and the potential of the RCed is 1.5 V for the reference potential of 0.5 V.

Till t7, the internal supply voltages VSPe/o and VSN3/o are kept active so as to latch the data of the flip-flop. For the time period from t6 to a time point just before t11, the selected word line potential is the verify voltage of 1.5 V.

The discharge time period of the memory cells at the verify time on the even side is from the selection of the gate signal SG2u of the source side Select Gate2 at t7 to the inactivation of the gate signal SG1u of the drain side Select Gate1 at t8. For this time period, the flip-flop on the even side is reset by the activation of the signal RSLeu/d.

For the subsequent period from t8 to t9, the TReu/d is selected, and the supply voltages VSPe and VSNe of the even side flip-flop are activated again, so that the data of the verified memory cells are taken in by the even side flip-flop. In other words, the potential of the data lines is held in the discharge state or at the precharge voltage in dependence upon whether the threshold voltage or the data of the memory cells is low or high. For the period from t9 to t11, the potential of the data line Dun-1 at the verify time on the even side, the sub data line Sub Data Line and the sub source line Sub Source Line are discharged to the ground voltage Vss.

Next, the verify operation on the odd side is executed like the even side verification for the period from t10 to t11. For the subsequent period from t11 to t13, the end of all the bits of the memory cell threshold voltage is judged. If the threshold voltage of all the memory cells is lowered, the data of the flip-flop is at the ground voltage Vss, and this voltage Vss is judged. After the ALeu and ALou are activated (for the period from t11 to t12), their potential is verified. If the verified potential is the ground voltage Vss, the operation is returned to t2 to continue the operation of lowering the threshold voltage. If the ALeu and ALou are at the High level, on the other hand, the operation of lowering the threshold voltage is ended.

The operation sequence for raising the threshold voltage of the memory cells will be described with reference to FIG. 31. When this operation is the program operation, data are inputted so that the flip-flop in the sense latch circuit SL, corresponding to the bits connected with the memory cells latching the lower threshold voltage (erase state), is set to "1" whereas the flip-flop connected with the memory cells to be rewritten to the higher threshold voltage (selective write) is set to "0". In the case of the erase operation, all the data are set to "0".

After this, the rewrite operation is executed to inject electrons into the floating gate by the channel overall Fowler-Nordheim tunnel phenomenon. In the verification, the voltage of the selected word line is set to, say, 2.8 V, and all the data lines are precharged. The cell current flows in the memory cell which has not reached the rewrite threshold voltage level, i.e., the verify word line voltage of 2.8 V, to establish the Fail state in which the potential of the data lines is discharged. As a result, the data of the flip-flop retain "0".

In the memory cell having reached 2.8 V, on the other hand, no cell current flows to establish the Pass state, in which the potential of the data lines is held at the precharged voltage to rewrite the data of the flip-flop to "1". The data of the flip-flop, after verified, are used as the data for rewrite, and the threshold voltage raising operation and the verify operation are repeated. The operations are ended when all the data of the flip-flop take the value "1". This batch judgment is automatically accomplished in the chip.

FIG. 34 shows the timing waveforms for operating the sense latch circuit SL in the operation of raising the threshold voltage of the memory cells.

The data of the flip-flop are defined till t2; the threshold voltage is raised for the period from t2 to t6; the even side is verified from t6 to t12; the odd side is verified from t12 to t13; and the ends of all bits of the memory cell threshold voltage are judged during the time from t13 to t15.

In the case of the erase operation of raising the threshold voltage, the data of the flip-flop are set in the wholly selected state for the period from t1 to t2 by selecting the selected side RSLed and RSLod and by activating the supply voltages VSPe/o and VSNe/o of the flip-flop. In the case of the program operation for raising the threshold voltage, moreover, the write data are inputted till t1 to the flip-flop constituting the sense latch circuit SL, and the time period from t1 to t2 is skipped to the timing waveform from t2.

For the period from t2 to t3, the PCou is activated to transmit the data of the flip-flop to the data lines. For the subsequent period to t6, the threshold voltage raising operation can be executed like the threshold voltage lowering operation by activating the signal lines. Here, the potential of the target word line which has been rewritten is set by applying a high voltage of 16 V of the word line voltage, by setting the supply voltage VSPe/o of the flip-flop to the unselected channel/drain voltage of 8 V and by setting the potential of the gate signals TReu/d, TRou/d and SG1u/d of the MOS transistors for transferring the drain voltage, to the selection return transfer gate voltage of 9 V.

For the period from t6 to t7, the voltage of the RCeu of 2.0 V and the voltage of the RCed of 1.5 V are applied so as to feed the precharge potential to all the selected data lines and the reference potential to the data lines of the unselected side memory matrix Memory Matrix. The discharge period of the memory cells at the verify time on the even side is from the time of the selection of the gate signal SG2u of the source side Select Gate2 at t7 to the time of the inactivation of the gate signal SG1u of the drain side Select Gate1 at t8.

For the period from t8 to t9, the PCeu/d is selected to transmit the data of the flip-flop to the data lines. After this, the data of the verified memory cells can be taken in by the flip-flop on the even side by resetting the flip-flop for the period from t9 to t10 and by selecting the TReu/d for the period from t10 to t11 to activate the supply voltages VSPe and VSNe of the flip-flop on the even side again.

Next, the verification on the odd side is executed for the period from t12 to t13 like the verification on the even side. After this, judgment is executed for the period from t13 to t15. If the threshold voltage of the memory cells, the threshold voltage of which is to be raised, is over the verify word line voltage, the data of the flip-flop are at the potential of the supply voltage VSPe/o, and this High state is judged. To make this judgment, the ALed and ALod on the unselected side are activated for verification. In the case of the ground voltage Vss, the operation of raising the threshold voltage is started from t2, and the operations are ended when the level is high.

As described above, the threshold voltages of the memory cell, corresponding to the information of the semiconductor nonvolatile memory device, can be made equal, as shown in FIG. 17. In order to cope with binary or other multi-value data, the threshold voltages are made equal, for example, by bringing the lowest threshold voltage into the erase state, by controlling it for every bit, by inputting the write data for raising the threshold voltage each time and by controlling the write data for every bit. On the other hand, the highest threshold voltage may be brought into the erase state to realize the low threshold voltage by the write operation.

With reference to the characteristic diagrams of FIGS. 9 to 13, here will be sequentially described the effects, as the features of the embodiment, which can be achieved by applying the read-selected word line voltage Vrw lower than the supply voltage Vcc fed from the outside, by reducing the threshold voltage difference between the higher threshold voltage VthH and the lower threshold voltage VthL of the two states of the memory cells and by defining the threshold voltage Vthi in the thermally equilibrium state of the memory cells between the values VthH and VthL.

Figure 9:
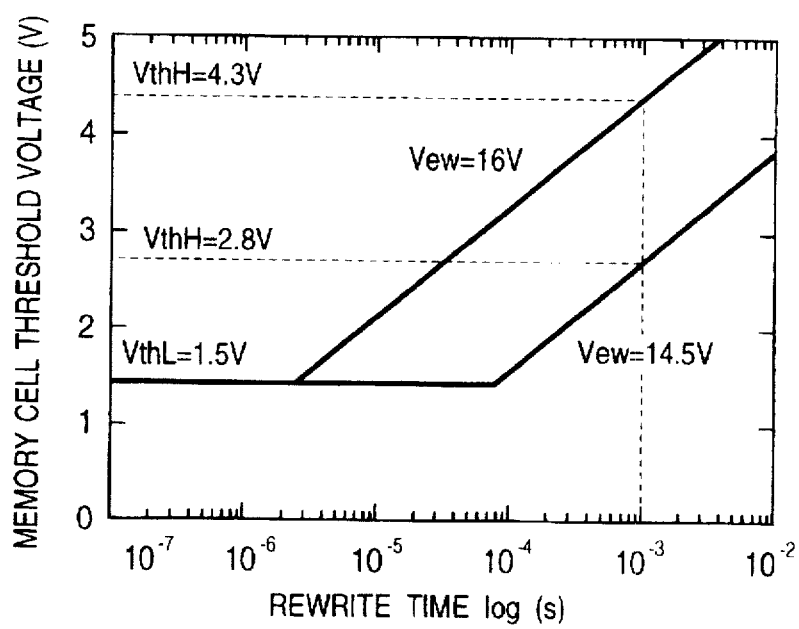
FIG. 9 is a characteristic diagram showing a memory cell threshold voltage with respect to change of time of the present embodiment.

FIG. 9 is a diagram showing the memory cell threshold voltage with respect to the time change, that is, the characteristic of the threshold voltage with respect to the rewrite time. When the higher threshold voltage VthH is lowered from 4.3 V to 2.8 V to reduce the threshold voltage difference from the lower threshold voltage VthL (of 1.5 V), to 1.3 V, the erase word line voltage Vew can be lowered to 14.5 V in a rewrite time of 1 ms in the case of the embodiment, as compared with 16 V in the prior art. As a result, the rewrite voltage can be lowered.

Figure 10:
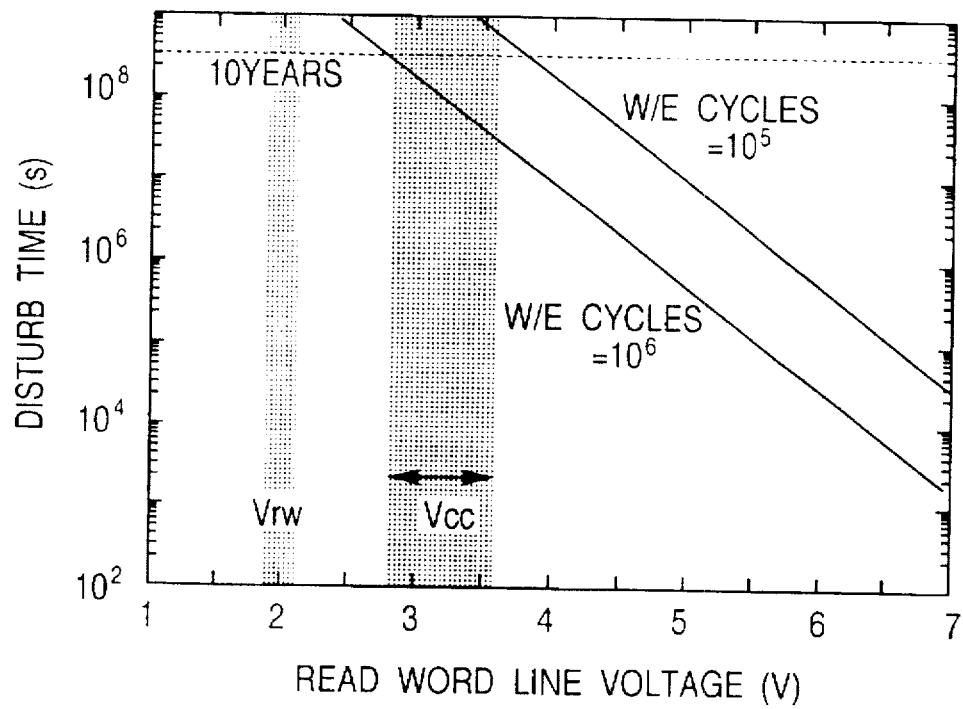
FIG. 10 is a characteristic diagram showing the disturb resistance of a memory cell with respect to the reading word line voltage of the present embodiment.

FIG. 10 is a diagram illustrating the disturb resistance of the memory cells against the read word line voltage after the rewrite cycles. For the supply voltage Vcc of 3.3 V and the read-selected word line voltage Vrw of 2.0 V, the rewrite cycles W/E can be increased to $10^6$ cycles in the case of embodiment for the disturb time of 10 years by applying the read-selected word line voltage Vrw lower than the supply voltage Vcc applied from the outside, as compared with $10^5$ cycles of the prior art. As a result, the read word line voltage can be lowered.

Figure 11:
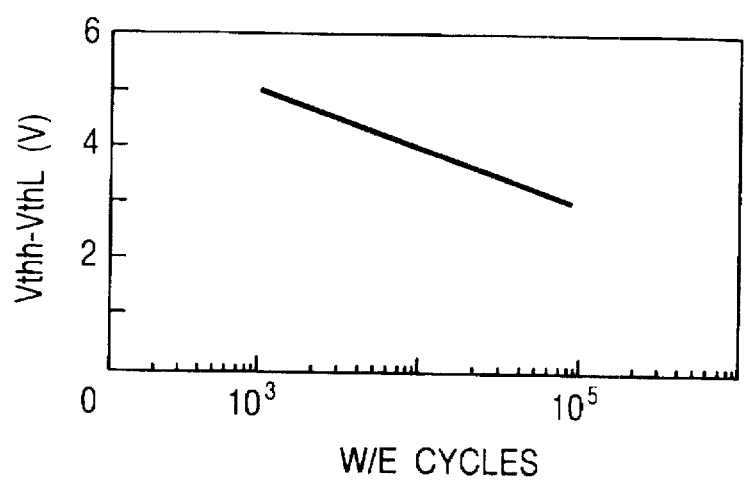
FIG. 11 is a characteristic diagram showing the change of (VthH−VthL) with respect to the rewrite cycles of the present embodiment.

FIG. 11 is a diagram showing the change of the difference (VthH–VthL) with respect to the rewrite cycle. For example, the change of the difference (VthH–VthL) is 3 V for the rewrite cycle of $10^5$ cycles and 5 V for $10^3$ cycles. In other words, the rewrite cycle can be increased by reducing the potential difference as in the embodiment. As a result, the rewrite cycle can be improved. Specifically, the total charge passing during the rewrite time is reduced by setting the rewrite threshold voltages VthH and VthL to, for example, 2.8 V and 1.5 V.

Figure 12:
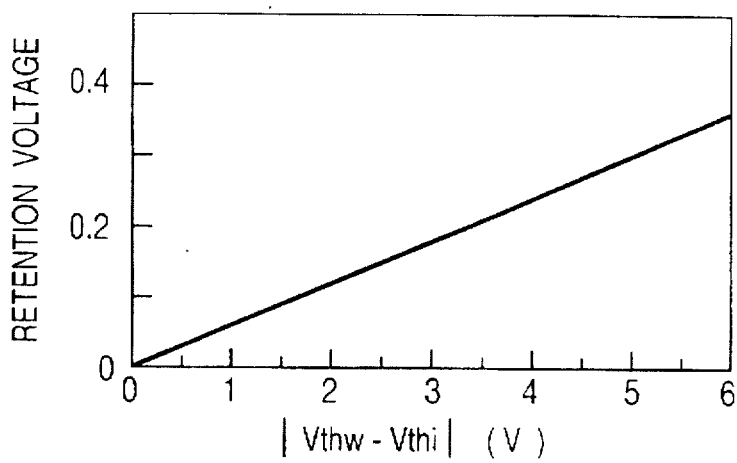
FIG. 12 is a characteristic diagram showing the data retention resistance against (Vthw−Vthi) of the present embodiment.

FIG. 12 is a diagram showing the data retention resistance against the difference (Vthw–Vthi). Specifically, since the retention characteristic of data are proportional to the difference between the threshold voltage Vthi in the thermally equilibrium state and the threshold voltage Vthw (e.g., VthH or VthL) after the rewrite, the read word line voltage can be determined, considering the two data retentions for the reliability, by defining the Vthi between the VthH and the VthL. In other words, the electric field of the tunnel insulating film at the retention time can be relaxed by reducing the differences between (VthH–Vthi) and (Vthi–VthL) to 0.8 V and 0.5 V.

Figure 13:
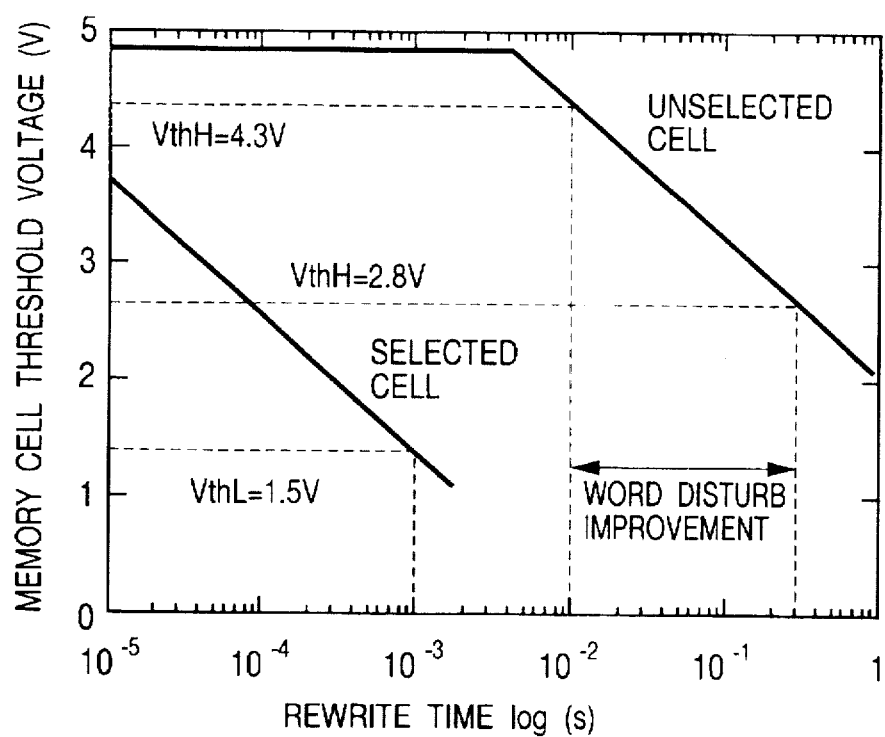
FIG. 13 is a characteristic diagram showing the memory cell threshold voltage with respect to change of time of the present embodiment.

FIG. 13 is a diagram showing the threshold voltages of the memory cells with respect to the rewrite time change. When the higher threshold voltage VthH is lowered from 4.3 V to 2.8 V to reduce the voltage difference from the lower threshold voltage VthL (1.5 V) to 1.3 V, the margin of the rewrite time of the unselected cells can be increased to 300 ms for the rewrite time of 1 ms of the selected cells in the case of the embodiment, as compared with the margin of 10 ms of the prior art. As a result, the word disturb resistance of the unselected cells can be improved.

In the semiconductor nonvolatile memory device of the present embodiment, therefore, the rewrite voltage can be lowered by applying a voltage lower than the supply voltage Vcc as the read-selected word line voltage thereby to lower the threshold voltage difference (VthH–VthL) of the two states of the memory cells. As a result, the damage on the insulating film at the time of injecting and releasing electrons into and out of the floating gate is reduced by lowering the rewrite operation voltage, so that the film deterioration is remarkably lightened to improve the restrictions upon the rewrite cycles drastically.

By defining the threshold voltage Vthi in the thermally equilibrium state of the memory cells between the threshold voltages VthH and VthL of the two states, moreover, the voltages applied to raise and lower the threshold voltage Vth can be equalized in the rewrite operation voltage.

Moreover, since the read word line voltage can be determined, in the retention characteristics of the data, considering the two data retentions for the reliability by defining the voltage Vthi between the voltage VthH and the voltage VthL, the disturb characteristic can be improved in the memory cell to be retained at a high threshold voltage in the operations of lowering the read word line voltage and raising the threshold voltage.

Still moreover, the threshold voltage Vthi in the thermally equilibrium can be brought close to the external supply voltage Vcc thereby to set the read word line voltage to the value Vcc. Alternatively, the read word line voltage may be brought closer to the high voltage Vthi which is boosted from the Vcc in the device. In short, the present embodiment is characterized in that the read word line voltage Vvw is near the value Vthi and in that the Vthi and VthH, and the Vthi and VthL are from 0.5 V to 2.0 V.

Although our invention has been specifically described on the basis of the embodiment, it should not be limited thereto but can naturally be modified in various manners within the scope thereof.

For example, the semiconductor nonvolatile memory device of the present embodiment has been described for the case in which it is applied to the flash memory (EEPROM). Despite of this description, however, the present invention should not be limited to the aforementioned embodiment but can be widely applied to another electrically rewritable nonvolatile semiconductor memory device such as an EEPROM or an EPROM.

Moreover, the application of the semiconductor nonvolatile memory device of the present embodiment is not limited to the flash memory in the form of the memory device unit, but it can be widely used as memory devices of various systems including a computer system, a digital still camera system or an automotive system, as will be described on the computer system of FIG. 14 by way of example.

Figure 14:
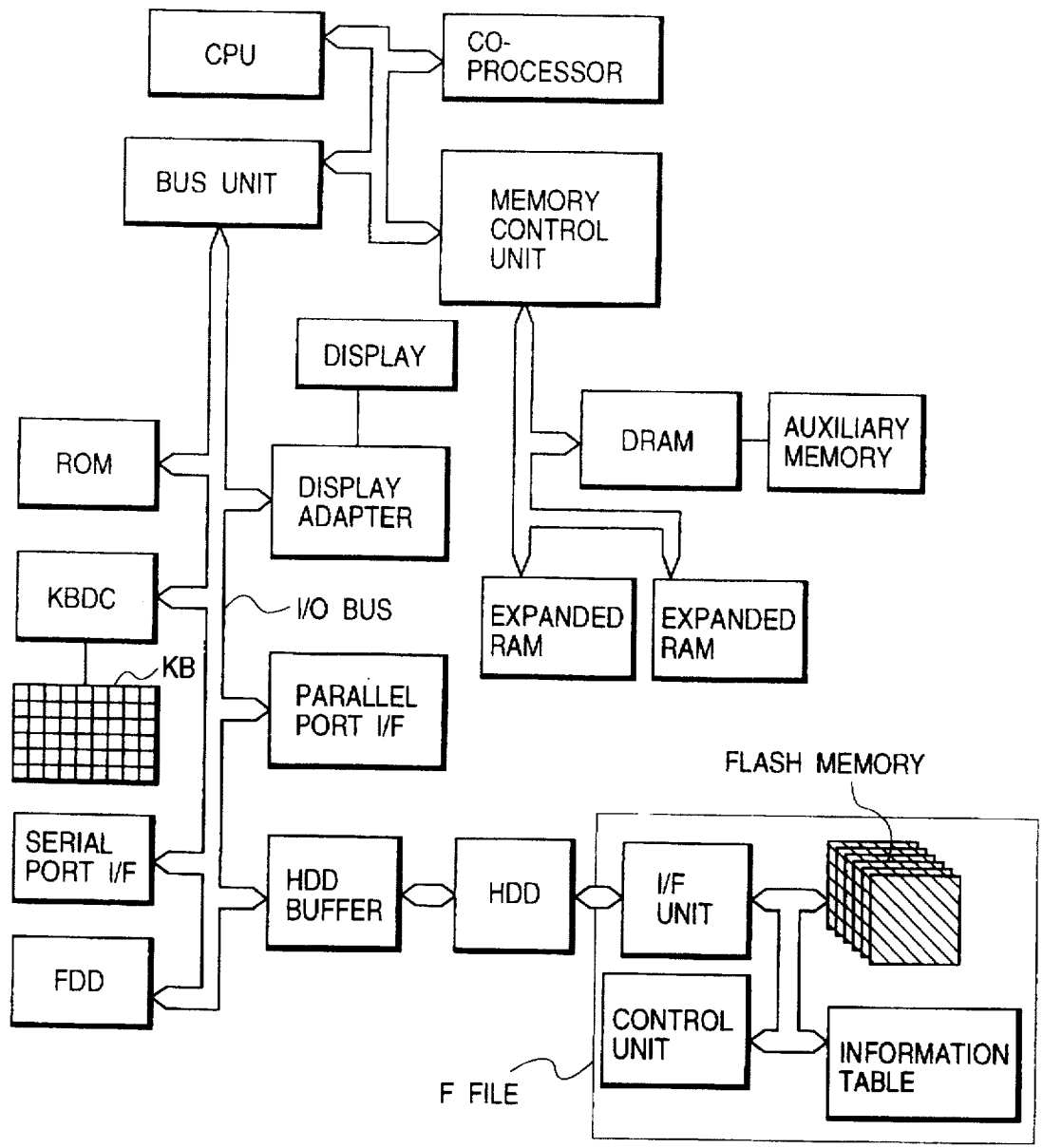
FIG. 14 is a functional block diagram showing a computer system using the semiconductor nonvolatile memory device of the present embodiment.

In FIG. 14, this computer system includes: a central processing unit CPU acting as an information device; an I/O bus provided in the data processing system; a Bus Unit; a memory control unit Memory Control Unit for accessing a high speed memory such as a main memory or an expanded memory; a DRAM serving as the main memory; a ROM in which the operating system program is stored; and a keyboard controller KBDC having a keyboard connected at its end. Moreover, a display adapter Display Adapter is connected with the I/O bus, and a display Display is connected to the end of the Display Adapter.

Connected with the I/O bus, further, are a parallel port Parallel Port I/F, a serial port Serial Port I/F such as a mouse, a floppy disk drive FDD, and a buffer controller HDD Buffer for conversion into the HDD IF from the I/O bus. An expanded RAM and a DRAM acting as the main memory are connected with the bus from the memory control unit Memory Control Unit.

Here will be described the operation of this computer system. When the power is supplied to start the operation, the central processing unit CPU makes an access at first to the ROM through the I/O bus to perform initial diagnosis and initial setting. Then, the DRAM acting as the main memory is loaded with the system program from the auxiliary memory device. Moreover, the central processing unit CPU causes the HDD controller to access to the HDD through the I/O bus.

At the end of loading of the system program, the processing is proceeded according to the request of the user. Incidentally,;the user proceeds the work while inputting/outputting the operation by the keyboard controller KBDC and the display adapter Display Adapter on the I/O bus. The user further exploits, as necessary, the input/output device which is connected with the parallel port Parallel Port I/F and the serial port Serial Port I/F.

The main memory is supplemented with the expanded RAM when the DRAM acting as the main memory in the system is short of the main memory capacity. When the user is to read/write a file, the user requests an access to the auxiliary memory device while regarding the HDD as the auxiliary memory device. In response to this request, the flash file system, constructed of the flash memory of the present invention, makes an access to the file data.

Thus, the memory device such as the flash memory can be widely applied as a flash file system of the computer system.

Figure 35:
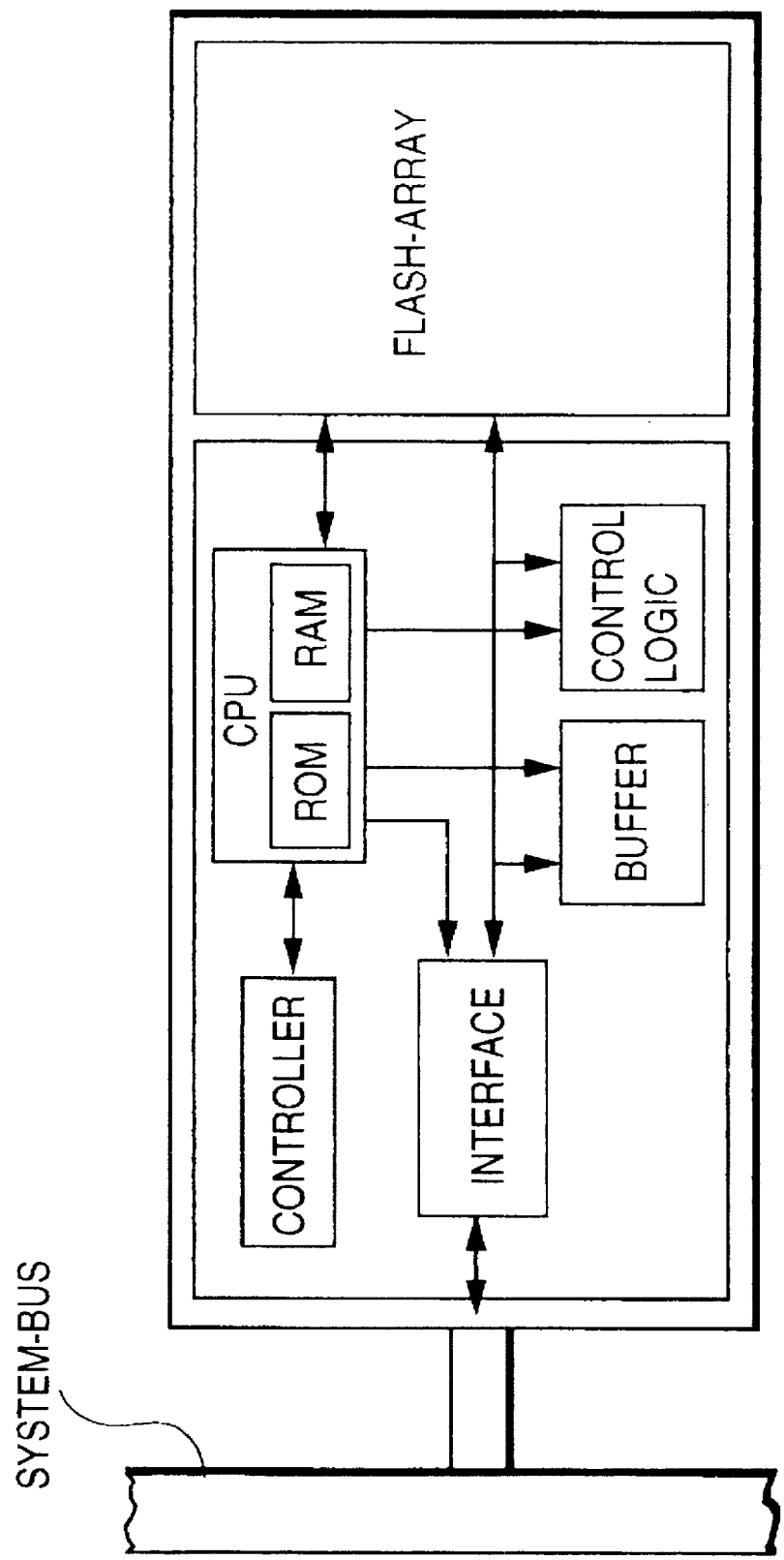
FIG. 35 is a functional block diagram showing a PC card using the semiconductor nonvolatile memory device of the present embodiment.

In a note type personal computer such as a computer system acting as a portable information terminal, a PC card removably inserted into the system is used. This PC card, as shown in FIG. 35, includes: a central processing unit CPU having a ROM and a RAM; a flash array FLASH-ARRAY connected with the CPU to exchange data; a controller Controller; a control logic circuit Control Logic connected to transmit the data; a buffer Circuit Buffer; and an interface circuit Interface.

In this PC card, moreover, data can be exchanged among the flash array FLASH-ARRAY, the control logic circuit Control Logic, the buffer circuit Buffer and the interface circuit Interface. The PC card is connected, when inserted into the system body, with the system bus SYSTEM-BUS through the interface circuit Interface.

For example, the central processing unit CPU manages the entire system according to the data type of 8 bits, that is, the interface control, the rewrite and read controls and the computation. The flash array FLASH-ARRAY is formed of, e.g., a flash device array of 32 Mbits, and one sector is composed of a data area of 512 bytes and a utility area of 16 bytes. One device is composed of 8,192 sectors.

Moreover, the controller Controller is formed of a cell base or discrete IC and is equipped with a sector table by the DRAM or SRAM. The control logic circuit Control Logic generates a timing signal and a control signal, and the buffer circuit Buffer is used to store the data during the rewrite temporarily.

As described above, a memory device such as a flash memory can also be used as a PC card, and the nonvolatile semiconductor memory device can be widely used in various systems required to rewrite data electrically.

The effects brought about by the representatives of the invention, as disclosed herein, will be briefly described in the following.

(1) By bringing the higher one of the threshold voltages of the two states of the memory cells closer to the lower threshold voltage thereby to lower the rewrite voltage, the mobile charge, which might cause the deterioration of the insulating film when electrons are injected into or released from the floating gate, can be reduced to suppress the deterioration of the insulating film, and hence the restriction upon the rewrite cycles can be drastically improved to improve the rewrite resistance.

(2) By defining the threshold voltage Vthi in the thermally equilibrium state between the higher and lower threshold voltages VthH and VthL of the two states of the memory cell, the voltages applied to raise and lower the threshold voltage Vth can be equalized in the rewrite operation voltage.

(3) In the retention characteristic of the data, by defining the threshold voltage Vthi in the thermally equilibrium state between the higher threshold voltages VthH and the lower threshold voltage VthL, the read word line voltage can be determined, considering the two data retentions for the reliability, to lower the read word line voltage and to improve the disturb characteristics of the memory cell retained at a high threshold voltage in the threshold voltage lowering operation.

(4) Especially in an electrically rewritable semiconductor nonvolatile memory device, the voltage can be lowered by the rewrite threshold voltage so that the deterioration of the insulating film at the time of injecting and releasing the electrons into and out of the floating gate can be suppressed to improve the rewrite resistance. As a result, especially the computer using the memory device can be reduced in the power consumption and improve in the reliability.

What is claimed is:

1. A semiconductor nonvolatile memory device comprising:

a plurality of word lines;

a plurality of memory cells each of which has a control gate and a floating gate and which stores data as a threshold voltage;

an external data terminal to which data is applied; and one external supply voltage terminal to which a positive supply voltage is applied,
wherein each of said plurality of memory cells is coupled to a corresponding word line of said plurality of word lines, and
wherein a read voltage to be applied to a selected word line in a read operation for outputting, through said external data terminal, data of memory cells coupled to said selected word line is higher than 0 V and is lower than said positive supply voltage applied to said one external supply voltage terminal.

2. A semiconductor nonvolatile memory device according to claim 1, wherein said read voltage is produced by lowering said positive supply voltage.

3. A semiconductor nonvolatile memory device according to claim 2, wherein said read voltage is at ±0.5 V of the threshold voltage in a thermally equilibrium state of said plurality of memory cells.

4. A semiconductor nonvolatile memory device according to claim 3, wherein the threshold voltage in the thermally equilibrium state of said memory cell is defined to be between the individual threshold voltages corresponding to binary information.

5. A semiconductor nonvolatile memory device according to claim 4, wherein said individual threshold voltages corresponding to said binary information have substantially equal potential differences from the threshold voltage in the thermally equilibrium state of said memory cell.

6. A semiconductor nonvolatile memory device according to claim 5, wherein said potential differences are at 0.5 to 2.0 V.

7. A semiconductor nonvolatile memory device according to claim 6, wherein a serial access can be made to selected memory cells of said plurality of memory cells.

8. A semiconductor nonvolatile memory device according to claim 7, wherein the data are read out by serially accessing selected memory cells of said plurality of memory cells.

9. A semiconductor nonvolatile memory device according to claim 8, wherein said positive supply voltage is +3.3 V.

10. A computer system comprising:

a semiconductor nonvolatile memory device; and a central processing unit coupled to be in electrical communication with the nonvolatile memory device wherein said semiconductor nonvolatile memory device, includes:

a plurality of word lines;

a plurality of memory cells each of which has a control gate and a floating gate and which stores data as a threshold voltage;

an external data terminal to which data is applied; and one external supply voltage terminal to which a positive supply voltage is applied, wherein each of said plurality of memory cells is coupled to a corresponding word line of said plurality of word lines, and wherein a read voltage to be applied to a selected word line in a read operation for outputting, through said external data terminal, data of memory cells coupled to said selected word line is higher than 0 V and is lower than said positive supply voltage applied to said one external supply voltage terminal.

11. A semiconductor nonvolatile memory device according to claim 11, wherein said positive supply voltage is +3.3 V.

12. A semiconductor nonvolatile memory device which comprises:

one external voltage terminal to which a positive supply voltage is applied;

a memory cell array including a plurality of nonvolatile semiconductor memory cells each having a control gate, a floating gate, a drain and a source, and arranged in an array;

a plurality of word lines to each of which the control gates of corresponding memory cells of said plurality of memory cells are commonly coupled;

a plurality of data lines to each of which the drains of corresponding memory cells of said plurality of memory cells are commonly coupled; and sense latch circuits each of which is coupled to a corresponding data line of said plurality of data lines wherein in a read operation, in which said sense latch circuits store data of memory cells coupled to a selected word line, a read voltage which is applied to said selected word line from said plurality of word lines is lower than said positive supply voltage and is higher than 0 V.

13. A semiconductor nonvolatile memory device according to claim 12, wherein said read voltage is produced by lowering said positive supply voltage.

14. A semiconductor nonvolatile memory device according to claim 13, wherein said read voltage is at ±0.5 V of the threshold voltage in a thermally equilibrium state of said plurality of memory cells.

15. A semiconductor nonvolatile memory device according to claim 14, wherein the threshold voltage in the thermally equilibrium state of said memory cell is defined to be between the individual threshold voltages corresponding to binary information.

16. A semiconductor nonvolatile memory device according to claim 15, wherein said individual threshold voltages corresponding to said binary information have substantially equal potential differences from the threshold voltage in the thermally equilibrium state of said memory cell.

17. A semiconductor nonvolatile memory device according to claim 16, wherein said potential differences are at 0.5 to 2.0 V.

18. A semiconductor nonvolatile memory device according to claim 17, wherein a serial access can be made to selected memory cells of said plurality of memory cells.

19. A semiconductor nonvolatile memory device according to claim 18, wherein the data are read out by serially accessing selected memory cells of said plurality of memory cells.

20. A semiconductor nonvolatile memory device according to claim 19, further comprising a data terminal which is supplied with data, said data terminal being coupled to said data lines via said sense latch circuits, respectively.

21. A semiconductor nonvolatile memory device according to claim 20, wherein said data which is stored in said sense latch circuits, in said read operation, is sequentially supplied to said data terminal.

22. A semiconductor nonvolatile memory device according to claim 21, wherein said positive supply voltage is +3.3 V.

23. A computer system comprising:

a semiconductor nonvolatile memory device; and a central processing unit, coupled to be in electrical communication with the nonvolatile memory device, wherein said semiconductor nonvolatile memory device includes:

one external supply voltage terminal to which a positive supply voltage is applied, a memory cell array including a plurality of nonvolatile semiconductor memory cells each having a control gate, a floating gate, a drain and a source, and arranged in an array;

a plurality of word lines to each of which the control gates of corresponding memory cells of said plurality of memory cells are commonly coupled;

a plurality of data lines to each of which the drains of corresponding memory cells of said plurality of memory cells are commonly coupled; and sense latch circuits each of which is coupled to a corresponding data line of said plurality of data lines, wherein in a read operation, in which said sense latch circuits store data of memory cells coupled to a selected word line, a read voltage which is applied to said selected word line is lower than said positive supply voltage and is higher than 0 V.

24. A semiconductor nonvolatile memory device according to claim 23, wherein said positive supply voltage is +3.3 V.

25. A semiconductor nonvolatile memory device which comprises:

one external voltage terminal to which a positive supply voltage is applied;

a memory cell array including a plurality of nonvolatile semiconductor memory cells each having a control gate, a floating gate, a drain and a source, and arranged in an array;

a plurality of word lines to each of which the control gates of corresponding memory cells of said plurality of memory cells are commonly coupled;

a plurality of data lines to each of which the drains of corresponding memory cells of said plurality of memory cells are commonly coupled; and sense latch circuits each of which includes a flip-flop circuit coupled to said one external voltage terminal and each of which is coupled to a corresponding data line of said plurality of data lines, wherein in a read operation, in which said sense latch circuits store data of memory cells coupled to a selected word line, a read voltage which is applied to said selected word line from said plurality of word lines is lower than said positive supply voltage and is higher than 0 V.

26. A semiconductor nonvolatile memory device according to claim 25, wherein said read voltage is produced by lowering said positive supply voltage.

27. A semiconductor nonvolatile memory device according to claim 26, wherein threshold voltages of said plurality of memory cells are in one of a first region lower than said read voltage and a second region higher than said read voltage, a threshold voltage in said thermally equilibrium state is defined to be between said first region and said second region.

28. A semiconductor nonvolatile memory device according to claim 27, wherein said read voltage is at ±0.5 V of the threshold voltage in a thermally equilibrium state of said plurality of memory cells.

29. A semiconductor nonvolatile memory device according to claim 28, wherein a potential difference between said first region and said threshold voltage in said thermally equilibrium state is substantially equal to a potential difference between said second region and said threshold voltage in said thermally equilibrium state.

30. A semiconductor nonvolatile memory device according to claim 29, wherein said potential differences are 0.5 to 2.0 V.

31. A semiconductor nonvolatile memory device according to claim 30, wherein a serial access can be made to selected memory cells of said plurality of memory cells.

32. A semiconductor nonvolatile memory device according to claim 31, wherein said data which is stored in said sense latch circuits, in said read operation, is sequentially supplied to said data terminal.

33. A semiconductor nonvolatile memory device according to claim 32, wherein said read voltage is at ±0.5 V of the threshold voltage in a thermally equilibrium state of said plurality of memory cells.

* * * * *